(12) United States Patent
Matsumoto

(10) Patent No.: US 11,019,719 B2
(45) Date of Patent: May 25, 2021

(54) PRINTED CIRCUIT BOARD, PRINTED WIRING BOARD, AND ELECTRONIC DEVICE

(71) Applicant: CANON KABUSHIKI KAISHA, Tokyo (JP)

(72) Inventor: Shoji Matsumoto, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/928,467

(22) Filed: Jul. 14, 2020

(65) Prior Publication Data

US 2021/0045228 A1 Feb. 11, 2021

(30) Foreign Application Priority Data

Aug. 6, 2019 (JP) .............................. JP2019-144514
Jul. 1, 2020 (JP) .............................. JP2020-114241

(51) Int. Cl.
*H05K 1/02* (2006.01)

(52) U.S. Cl.
CPC .............. *H05K 1/024* (2013.01); *H05K 1/025* (2013.01)

(58) Field of Classification Search
CPC ................................ H05K 1/024; H05K 1/025
USPC ........................................................ 174/250
See application file for complete search history.

(56) References Cited

U.S. PATENT DOCUMENTS

| 7,564,695 | B2 | 7/2009 | Matsumoto | |
|---|---|---|---|---|
| 7,595,546 | B2 | 9/2009 | Matsumoto | |
| 8,428,155 | B2 | 4/2013 | Matsumoto | |
| 9,192,044 | B2 | 11/2015 | Hayashi | |
| 10,306,761 | B2 | 5/2019 | Numagi | |
| 10,716,211 | B2 | 7/2020 | Numagi | |
| 2011/0126221 | A1* | 5/2011 | Kitayama | G11B 17/056 |
| | | | | 720/600 |
| 2014/0133108 | A1* | 5/2014 | Kagaya | H01P 3/088 |
| | | | | 361/748 |
| 2019/0191563 | A1* | 6/2019 | Kim | H05K 1/024 |
| 2020/0098816 | A1 | 3/2020 | Matsumoto | |

FOREIGN PATENT DOCUMENTS

JP    2014-116541    6/2014

\* cited by examiner

*Primary Examiner* — Sherman Ng
(74) *Attorney, Agent, or Firm* — Venable LLP

(57) ABSTRACT

A printed circuit board includes an electrical component including a signal terminal, and a printed wiring board on which the electrical component is mounted. The printed wiring board includes a signal line connected to the signal terminal. The signal line includes a first line portion, a second line portion, a third line portion, and a fourth line portion disposed continuously in this order. The signal terminal is joined with the fourth line portion such that the signal terminal and the fourth line portion form an integral structure. A second characteristic impedance of the second line portion is lower than a first characteristic impedance of the first line portion. A third characteristic impedance of the third line portion is higher than the first characteristic impedance. A fourth characteristic impedance of the integral structure formed by the fourth line portion and the signal terminal is lower than the first characteristic impedance.

20 Claims, 10 Drawing Sheets

— EXAMPLE 1
--- EXAMPLE 2
----- COMPARATIVE EXAMPLE 1

— EXAMPLE 3
— — EXAMPLE 4
- - - COMPARATIVE EXAMPLE 2

PRINTED CIRCUIT BOARD, PRINTED WIRING BOARD, AND ELECTRONIC DEVICE

BACKGROUND OF THE INVENTION

Field of the Invention

The present invention relates to a wiring technology for printed circuit boards.

Description of the Related Art

A printed circuit board includes signal lines used for transmitting signals. The signal lines are designed under some limitations, and one limitation relates to the shape of a pad on which an electrical component is mounted. Commonly, the line width of the pad is larger than that of a main line of a corresponding signal line. Thus, since the characteristic impedance of the pad becomes lower than that of the main line, a mismatch of characteristic impedance occurs at a boundary between the main line and the pad. The mismatch of characteristic impedance affects the quality of signal waveform. For suppressing the mismatch of characteristic impedance of a pad, Japanese Patent Application Publication No. 2014-116541 proposes a technique in which an opening is formed in a ground plane that faces the pad.

However, the speed of signals transmitted through the signal lines tends to be increased. As the transmission speed of the signals is increased, the signals are increasingly required to have higher quality, and thus the printed circuit board is required to be improved.

SUMMARY OF THE INVENTION

According to a first aspect of the present invention, a printed circuit board includes an electrical component including a signal terminal, and a printed wiring board on which the electrical component is mounted. The printed wiring board includes a signal line connected to the signal terminal. The signal line includes a first line portion, a second line portion, a third line portion, and a fourth line portion disposed continuously in this order. The signal terminal is joined with the fourth line portion such that the signal terminal and the fourth line portion form an integral structure. A second characteristic impedance of the second line portion is lower than a first characteristic impedance of the first line portion. A third characteristic impedance of the third line portion is higher than the first characteristic impedance. A fourth characteristic impedance of the integral structure formed by the fourth line portion and the signal terminal is lower than the first characteristic impedance.

According to a second aspect of the present invention, a printed circuit board includes an electrical component including a signal terminal, and a printed wiring board on which the electrical component is mounted. The printed wiring board includes a signal line connected to the signal terminal. The signal line includes a first line portion, a second line portion, a third line portion, and a fourth line portion disposed continuously in this order. The signal terminal is joined with the fourth line portion. A line width of the second line portion is larger than a line width of the first line portion. A line width of the third line portion is smaller than the line width of the first line portion. A line width of the fourth line portion is larger than the line width of the first line portion.

According to a third aspect of the present invention, a printed wiring board on which an electrical component is mounted includes a signal line connected to a signal terminal of the electrical component. The signal line includes a first line portion, a second line portion, a third line portion, and a fourth line portion formed continuously. The signal terminal is configured to be joined with the fourth line portion. A characteristic impedance of the second line portion is lower than a characteristic impedance of the first line portion. A characteristic impedance of the third line portion is higher than the characteristic impedance of the first line portion. A characteristic impedance of the fourth line portion is lower than the characteristic impedance of the first line portion.

According to a fourth aspect of the present invention, a printed wiring board on which an electrical component is mounted includes a signal line connected to a signal terminal of the electrical component. The signal line includes a first line portion, a second line portion, a third line portion, and a fourth line portion formed continuously. The signal terminal is configured to be joined with the fourth line portion. A line width of the second line portion is larger than a line width of the first line portion. A line width of the third line portion is smaller than the line width of the first line portion. A line width of the fourth line portion is larger than the line width of the first line portion.

Further features of the present invention will become apparent from the following description of exemplary embodiments with reference to the attached drawings.

DESCRIPTION OF THE EMBODIMENTS

Hereinafter, some embodiments of the present invention will be described in detail with reference to the accompanying drawings.

First Embodiment

Figure 1:
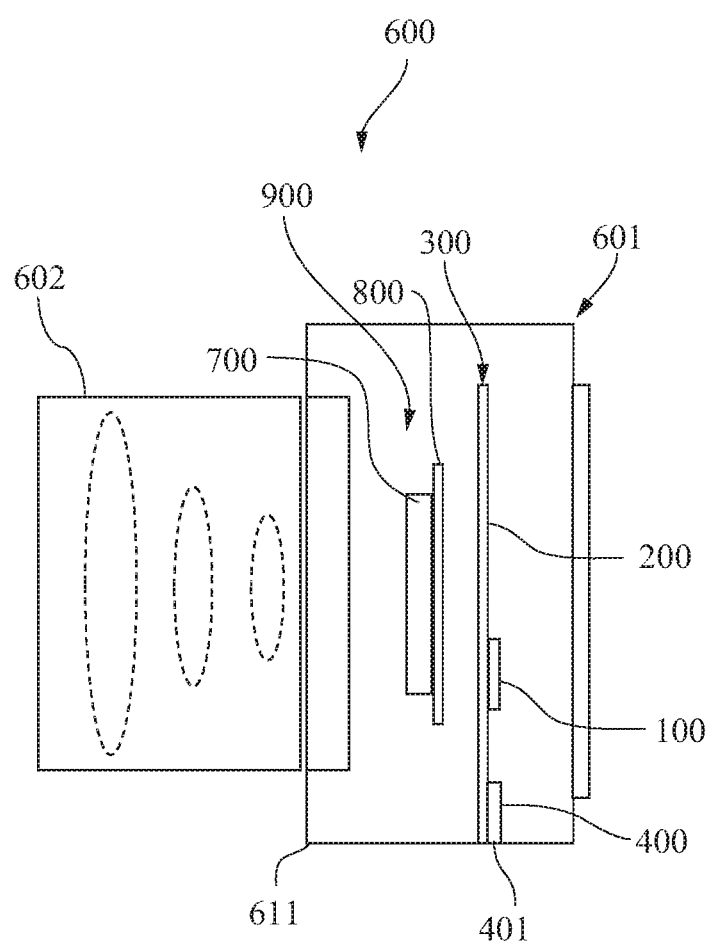
FIG. 1 is a diagram illustrating an electronic device of a first embodiment.

FIG. 1 is a diagram illustrating a digital camera 600, which is an image pickup device that is one example of an electronic device of a first embodiment. The digital camera 600, which is an image pickup device, is a digital camera with interchangeable lenses; and includes a camera body 601. To the camera body 601, a lens unit (lens barrel) 602 including lenses is detachably attached. The camera body 601 includes a housing 611, a processing module 300, and a sensor module 900. The processing module 300 and the sensor module 900 are disposed in the housing 611. The processing module 300 is one example of a printed circuit board, and is also one example of a semiconductor module. The processing module 300 and the sensor module 900 are electrically connected with each other via a cable (not illustrated).

The sensor module 900 includes an image sensor 700 that is an image pickup element, and a printed wiring board 800. The image sensor 700 is mounted on the printed wiring board 800. The image sensor 700 may be a complementary metal oxide semiconductor (CMOS) image sensor or a charge coupled device (CCD) image sensor. The image sensor 700 has a function that converts the light having passed through the lens unit 602, to an electric signal.

The processing module 300 includes a semiconductor device 100, a connector 400, and a printed wiring board 200. The connector 400 is one example of an electrical component. The semiconductor device 100 and the connector 400 are mounted on the printed wiring board 200. The printed wiring board 200 is a rigid board. The semiconductor device 100 may be a digital signal processor; and has a function to receive an electrical signal from the image sensor 700, correct the electrical signal, and create image data.

The connector 400 serves as an interface between the processing module 300 and an external device, and may be a universal serial bus (USB) connector or a high-definition multimedia interface (HDMI) (registered trademark) connector. The connector 400 includes an insertion opening 401, into which a USB cable connector (not illustrated) or an HDMI (registered trademark) cable connector (not illustrated) is inserted or from which the USB cable connector or the HDMI cable connector is removed. The connector 400 is disposed in the housing 611 such that the insertion opening 401 is exposed to the outside from the housing 611 of the camera body 601.

Figure 2:
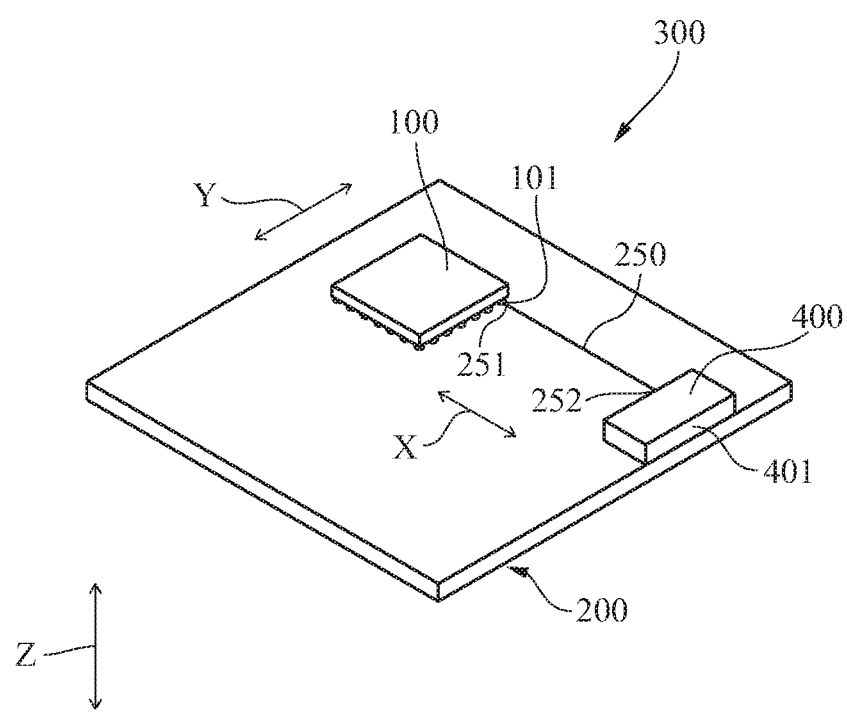
FIG. 2 is a perspective view of a processing module of the first embodiment.

FIG. 2 is a perspective view of a processing module 300 of the first embodiment. The semiconductor device 100 is a semiconductor package. In the first embodiment, the semiconductor device 100 is a ball grid array (BGA) semiconductor package.

The printed wiring board 200 includes a signal line 250 that electrically connects the semiconductor device 100 and the connector 400. The signal line 250 is a line through which a digital signal is transmitted from the semiconductor device 100 to the connector 400. Note that in the printed wiring board 200 of FIG. 2, lines other than the signal line 250, such as a power line, a ground line, and a signal line other than the signal line 250, are not illustrated.

In addition, although the single signal line 250 (through which a signal is transmitted) is illustrated in FIG. 2, a plurality of signal lines 250 may be disposed. In this case, the plurality of signal lines 250 may constitute a bus.

The signal line 250 extends in a wiring direction, that is, in an X direction that is a longitudinal direction of the signal line 250. The thickness direction of the signal line 250 is defined as a Z direction, and the width direction of the signal line 250 is defined as a Y direction. The Z direction is equal to the thickness direction of the printed wiring board 200, and is a view direction when the printed wiring board 200 is viewed in plane.

The signal line 250 includes an end portion 251 and an end portion 252. The end portion 251 is a first end portion formed in the X direction, and the end portion 252 is a second end portion formed in the X direction and opposite to the end portion 251. The semiconductor device 100 includes a terminal 101 that outputs a digital signal. The terminal 101 is connected to the end portion 251 of the signal line 250. The transmission speed of the digital signal transmitted through the signal line 250 is 1 Gbps (giga bits per second) or more. In the first embodiment, the digital signal is a single-ended signal. The material of the signal line 250 contains electrically-conductive metal material such as copper or gold.

Figure 3A:
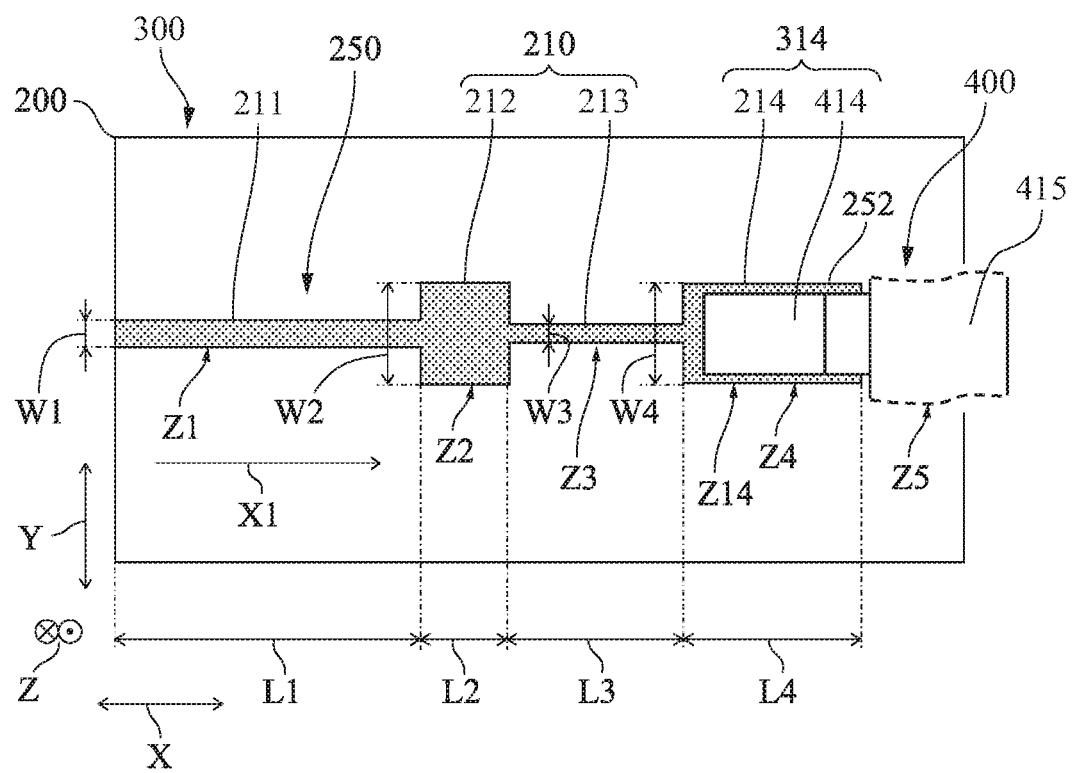
FIG. 3A is a plan view of one portion of the processing module of the first embodiment.
Figure 3B:
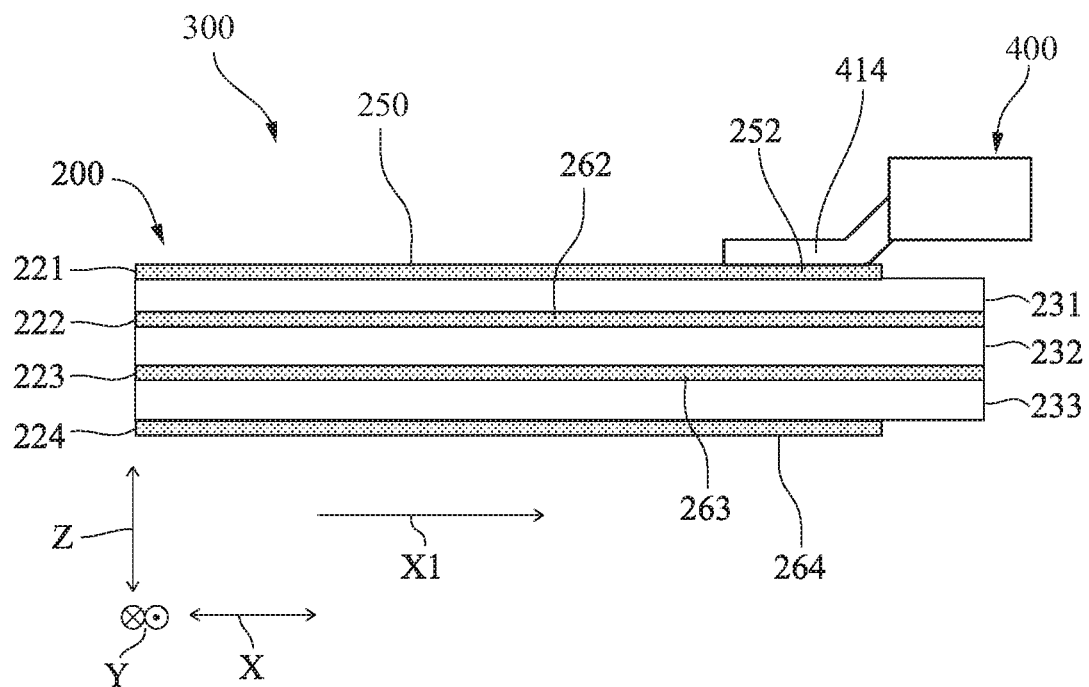
FIG. 3B is a sectional view of the one portion of the processing module of the first embodiment.

FIG. 3A is a plan view of one portion of the processing module 300 of the first embodiment. FIG. 3B is a sectional view of the one portion of the processing module 300 of the first embodiment. The printed wiring board 200 includes four conductor layers 221, 222, 223, and 224, and insulator layers 231, 232, and 233. The conductor layers 221, 222, 223, and 224 are disposed such that each of the insulator layers 231, 232, and 233 is sandwiched between adjacent conductor layers. The conductor layers 221 and 224 are surface layers or outer layers, and the conductor layers 222 and 223 are inner layers. The conductor layer 221 is a surface layer on which the semiconductor device 100 and the connector 400 are mounted. Note that a solder resist (not illustrated) may be formed on each of the conductor layers 221 and 224.

The signal line 250 is disposed in the conductor layer 221. The thickness of the signal line 250 in the Z direction is constant in the X direction and in the Y direction. In the conductor layer 222 adjacent to the conductor layer 221 via the insulator layer 231, a planar ground pattern 262 is disposed. In the conductor layer 223, a planar ground pattern 263 is disposed. In the conductor layer 224, a signal line 264 other than the signal line 250 is disposed.

The connector 400 is a surface-mount electrical component, and includes a terminal 414, which is a signal terminal. The terminal 414 is pin-shaped. The terminal 414 is connected to the end portion 252 of the signal line 250. The terminal 414 receives a signal. The transmission direction in which a signal is transmitted through the signal line 250 is defined as an X1 direction.

The signal line 250 includes line portions 211, 212, 213, and 214 formed continuously in the X direction. The line portion 211 is a first line portion, the line portion 212 is a second line portion, the line portion 213 is a third line portion, and the line portion 214 is a fourth line portion. In the present embodiment, the line portion 211, the line portion 212, the line portion 213, and the line portion 214 are continuously formed in this order, toward the X1 direction. The connector 400 includes a line portion 415 that is continuous with the terminal 414. The line portion 415 is a fifth line portion, and is an internal line of the connector 400.

The line portion 211 is a main line; and is longest in the X direction, in the line portions 211 to 214. The line portion 214 is a pad that can be joined with the terminal 414 of the connector 400 via solder. When the line portion 214 is joined with the terminal 414, an integral structure 314 is formed by the line portion 214 and the terminal 414. The line portion 214, which is a pad, is rectangular when viewed from the Z direction.

The characteristic impedance of the line portion 211 is denoted by Z1, the characteristic impedance of the line portion 212 is denoted by Z2, and the characteristic impedance of the line portion 213 is denoted by Z3. In addition, the characteristic impedance of the integral structure 314 formed by the line portion 214 and the terminal 414 is denoted by Z4. The characteristic impedance of the line portion 415 is denoted by Z5. In addition, the characteristic impedance of only the line portion 214 is denoted by Z14. The characteristic impedance Z1 is a first characteristic impedance, the characteristic impedance Z2 is a second characteristic impedance, and the characteristic impedance Z3 is a third characteristic impedance. In addition, the characteristic impedance Z4 is a fourth characteristic impedance, and the characteristic impedance Z5 is a fifth characteristic impedance.

The line width of the line portion 211 in the Y direction is denoted by W1, the line width of the line portion 212 in the Y direction is denoted by W2, the line width of the line portion 213 in the Y direction is denoted by W3, and the line width of the line portion 214 in the Y direction is denoted by W4. In addition, the length of the line portion 211 in the X direction is denoted by L1, the length of the line portion 212 in the X direction is denoted by L2, the length of the line portion 213 in the X direction is denoted by L3, and the length of the line portion 214 in the X direction is denoted by L4.

Figure 10A:
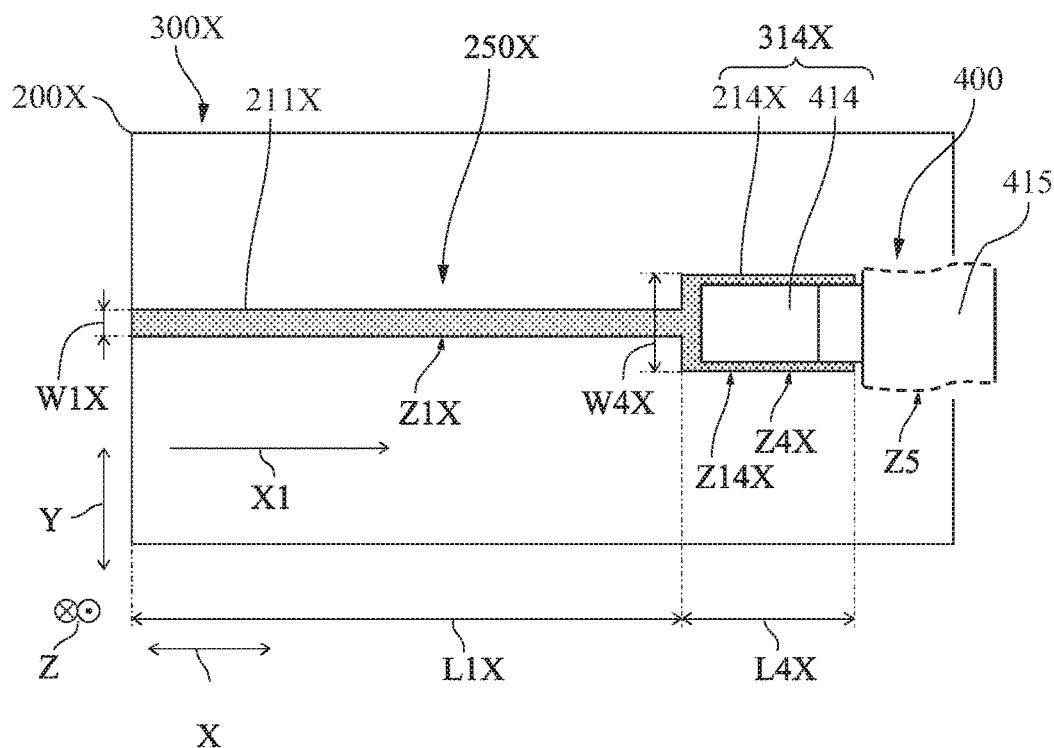
FIG. 10A is a plan view of one portion of a processing module of Comparative Example 1.

For comparison, a processing module of Comparative Example 1 will be described. FIG. 10A is a plan view of one portion of a processing module 300X of Comparative Example 1. The processing module 300X includes a connector 400 and a printed wiring board 200X. The connector 400 is the same as that of the first embodiment, and the printed wiring board 200X of Comparative Example 1 is different from the printed wiring board 200 of the first embodiment.

The printed wiring board 200X includes a signal line 250X whose structure is different from that of the signal line 250 of the first embodiment. The other structure of the printed wiring board 200X is the same as that of the printed wiring board 200 of the first embodiment. The signal line 250X includes a line portion 211X and a line portion 214X. The line portion 214X is continuous with the line portion 211X. The line portion 214X is a pad that can be joined with the terminal 414 of the connector 400 via solder. When the line portion 214X is joined with the terminal 414, an integral structure 314X is formed by the line portion 214X and the terminal 414.

A line width W4X of the line portion 214X is larger than a line width W1X of the line portion 211X. Thus, a characteristic impedance Z14X of the line portion 214X is lower than a characteristic impedance Z1X of the line portion 211X. As a result, a mismatch of characteristic impedance occurs between the line portion 211X and the line portion 214X.

When the terminal 414 of the connector 400 is joined with the line portion 214X, a characteristic impedance Z4X of the integral structure 314X, formed by the line portion 214X and the terminal 414, is lower than the characteristic impedance Z14X of only the line portion 214X on which the electrical component is not mounted. This is because the thickness of the integral structure 314X (formed by the line portion 214X and the terminal 414) in the Z direction is larger than the thickness of the terminal 414 in the Z direction. The thicker integral structure 314X increases a capacitance component produced by the electromagnetic coupling between the integral structure 314X and the ground pattern 262 (FIG. 3B). Thus, the difference, Z1X-Z4X, between the characteristic impedance Z1X and the characteristic impedance Z4X is larger than the difference, Z1X-Z14X, between the characteristic impedance Z1X and the characteristic impedance Z14X.

Also in the first embodiment, a line width W4 of the line portion 214 illustrated in FIG. 3A is larger than a line width W1 of the line portion 211. Thus, the characteristic impedance Z14 of the line portion 214 is lower than the characteristic impedance Z1 of the line portion 211. When the terminal 414 of the connector 400 is joined with the line portion 214, the characteristic impedance Z4 of the integral structure 314, formed by the line portion 214 and the terminal 414, is lower than the characteristic impedance Z14 of the line portion 214 on which the electrical component is not mounted. Thus, the difference, Z1-Z4, between the characteristic impedance Z1 and the characteristic impedance Z4 is larger than the difference, Z1-Z14, between the characteristic impedance Z1 and the characteristic impedance Z14.

In the first embodiment, the line portion 212 and the line portion 213 are disposed between the line portion 211 and the line portion 214. The line portion 212 and the line portion 213 are disposed for controlling the disturbance of voltage of a digital signal, caused by the difference, Z1-Z4, between the characteristic impedance Z1 and the characteristic impedance Z4. The two line portions 212 and 213 constitute a control line portion 210.

In the first embodiment, the line portions 211 to 214 have an identical thickness in the Z direction. A line width W2 of the line portion 212 is larger than the line width W1 of the line portion 211. Thus, the characteristic impedance Z2 of the line portion 212 is lower than the characteristic impedance Z1 of the line portion 211. A line width W3 of the line portion 213 is smaller than the line width W1 of the line portion 211. Thus, the characteristic impedance Z3 of the line portion 213 is higher than the characteristic impedance Z1 of the line portion 211. Since the control line portion 210 is disposed between the line portion 211 and the line portion 214, the reflection of signals caused by a mismatch of characteristic impedance between the integral structure 314 and the line portion 213 can be reduce, compared to the configuration of the comparative example where the integral structure 314X and the line portion 211X are disposed. In addition, because the characteristic impedance of the line portion 212 is lower than the characteristic impedance of the line portion 213 of the control line portion 210, the reflection of signals, caused by a mismatch of characteristic impedance between the integral structure 314 and the line portion 213, can be further reduced. In this manner, the disturbance of voltage of a digital signal, that is, the difference between a maximum peak value and a minimum peak value is reduced. Therefore, the quality of the digital signal transmitted through the line improves.

The characteristic impedance Z2 may be equal to or lower than the characteristic impedance Z4. The characteristic impedance Z2 is preferably higher than the characteristic impedance Z4 for stabilizing the voltage of the digital signal transmitted through the line. The characteristic impedance Z3 may be equal to or higher than the characteristic impedance Z5. The characteristic impedance Z3 is preferably lower than the characteristic impedance Z5 for stabilizing the voltage of the digital signal transmitted through the line.

Second Embodiment

Figure 4A:
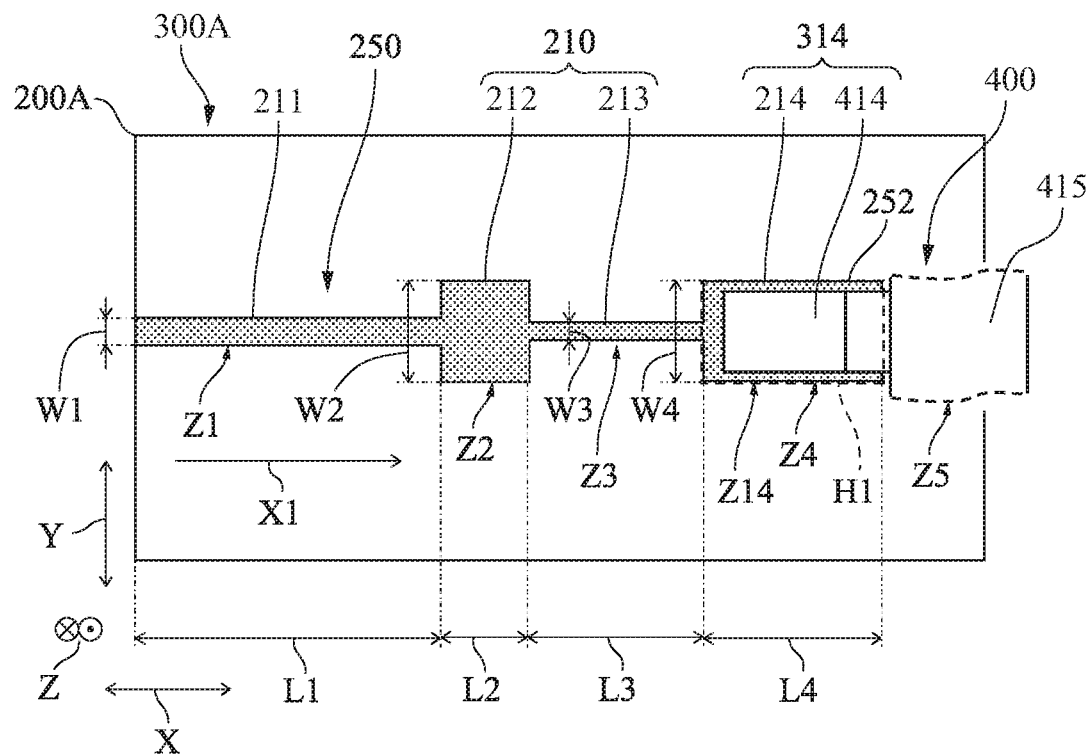
FIG. 4A is a plan view of one portion of a processing module of a second embodiment.
Figure 4B:
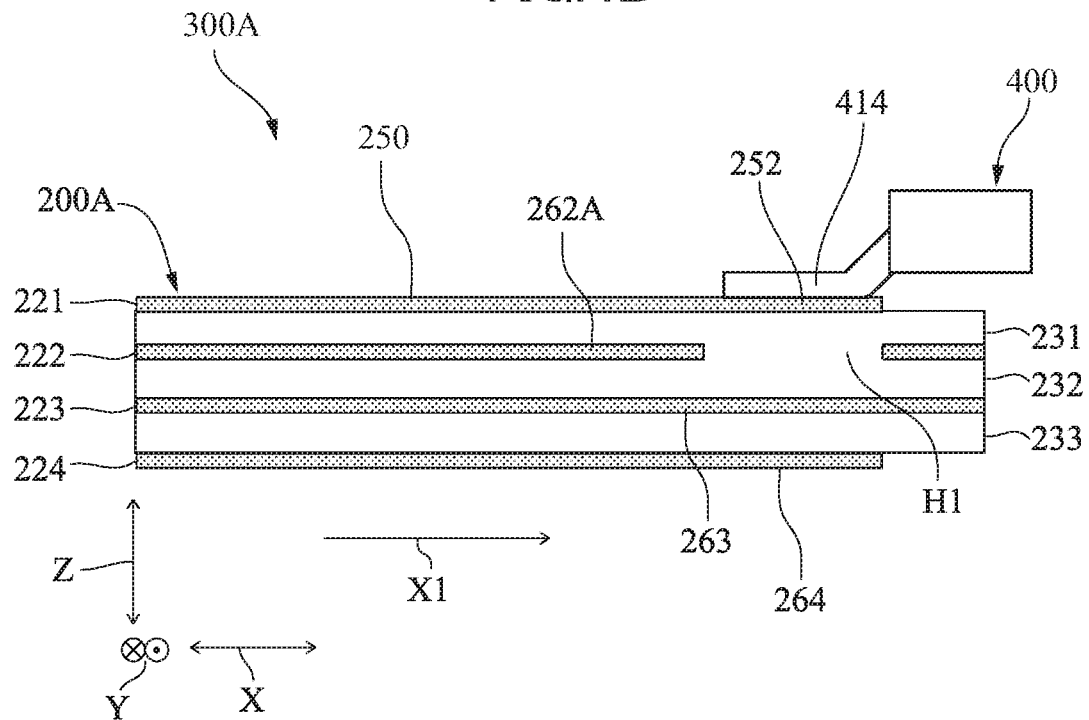
FIG. 4B is a sectional view of the one portion of the processing module of the second embodiment.

Next, a configuration of a digital camera that is one example of an electronic device of a second embodiment will be described. In the second embodiment, a configuration of a processing module of the digital camera is different from that of the first embodiment. For this reason, the processing module will be described. FIG. 4A is a plan view of one portion of a processing module 300A of the second embodiment. FIG. 4B is a sectional view of the one portion of the processing module 300A of the second embodiment. In the second embodiment, a component identical to a component of the first embodiment is given an identical symbol, and the description thereof will be omitted.

The processing module 300A, which is one example of a printed circuit board, includes a printed wiring board 200A and a connector 400 mounted on the printed wiring board 200A. As in the first embodiment, the processing module 300A includes the semiconductor device 100 of FIG. 2 (the semiconductor device 100 is not illustrated in FIGS. 4A and 4B). The semiconductor device 100 is mounted on the printed wiring board 200A.

As in the first embodiment, the printed wiring board 200A includes four conductor layers 221, 222, 223, and 224, and insulator layers 231, 232, and 233. The conductor layers 221, 222, 223, and 224 are disposed such that each of the insulator layers 231, 232, and 233 is sandwiched between adjacent conductor layers.

In the second embodiment, as in the first embodiment, a signal line 250 is disposed in the conductor layer 221. In the conductor layer 222, a planar ground pattern 262A is disposed. The ground pattern 262A is different from the ground pattern 262 (FIG. 3B) of the first embodiment.

The ground pattern 262A includes an opening H1. In a plan view of the printed wiring board 200A, that is, when viewed from the Z direction, the opening H1 overlaps with at least one portion of the line portion 214 of the signal line 250. In the second embodiment, when viewed from the Z direction, the opening H1 overlaps with the whole of the line portion 214.

Since the opening H1 is formed in the ground pattern 262A, the characteristic impedance Z4 of the integral structure 314 of the second embodiment is higher than the characteristic impedance Z4 of the integral structure 314 of the first embodiment. That is, in the second embodiment, the difference between the characteristic impedance Z1 and the characteristic impedance Z4 can be made lower than that in the first embodiment. Therefore, the quality of the digital signal further improves.

Third Embodiment

Figure 5:
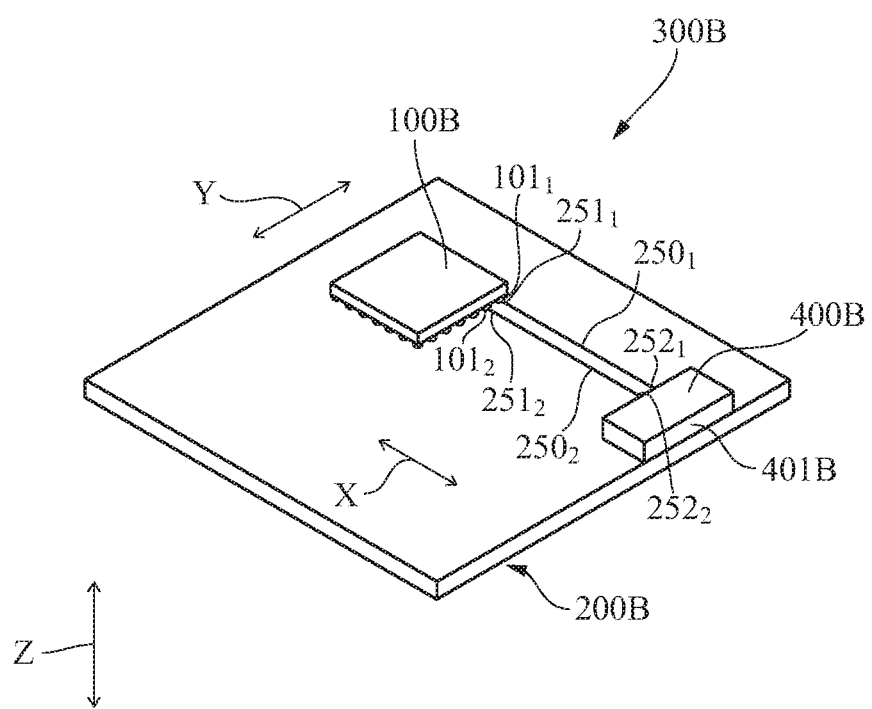
FIG. 5 is a perspective view of a processing module of a third embodiment.

Next, a configuration of a digital camera that is one example of an electronic device of a third embodiment will be described. In the third embodiment, a configuration of a processing module of the digital camera is different from that of the first embodiment. For this reason, the processing module will be described. FIG. 5 is a perspective view of a processing module 300B of the third embodiment. In the third embodiment, a component identical to a component of the first embodiment is given an identical symbol, and the description thereof will be omitted.

The processing module 300B includes a semiconductor device 100B, a connector 400B, and a printed wiring board 200B. The connector 400B is one example of an electrical component. The semiconductor device 100B and the connector 400B are mounted on the printed wiring board 200B. The printed wiring board 200B is a rigid board. The semiconductor device 100B may be a digital signal processor. The connector 400B includes an insertion opening 401B, into which a USB cable connector (not illustrated) or an HDMI (registered trademark) cable connector (not illustrated) is inserted and from which the USB cable connector or the HDMI cable connector is removed.

The printed wiring board 200B includes a pair of signal lines, each of which is the same as the signal line 250 of the first embodiment. That is, the printed wiring board 200B includes a pair of signal lines $250_1$ and $250_2$ that electrically connects the semiconductor device 100B and the connector 400B. Each of the signal lines $250_1$ and $250_2$ has the same structure as that of the signal line 250 of the first embodiment. However, a digital signal transmitted through the signal lines $250_1$ and $250_2$ is different from a digital signal transmitted through the signal line 250. That is, the digital signal transmitted through the signal line 250 is a single-ended signal in the first embodiment, whereas the digital signal transmitted through the pair of the signal lines $250_1$ and $250_2$ is a differential signal in the second embodiment. The signal lines $250_1$ and $250_2$, which constitute the pair, are disposed adjacent to each other.

Note that in the printed wiring board 200B of FIG. 5, lines other than the signal lines $250_1$ and $250_2$, such as a power line, a ground line, and a signal line other than the signal lines $250_1$ and $250_2$, are not illustrated. In addition, a plurality of pairs of the signal lines $250_1$ and $250_2$ may be disposed. In this case, the plurality of the pairs of signal lines $250_1$ and $250_2$ may constitute a bus.

The signal line $250_1$ includes an end portion $251_1$ and an end portion $252_1$. The end portion $251_1$ is a first end portion formed in the X direction, and the end portion $252_1$ is a second end portion formed in the X direction and opposite to the end portion $251_1$. Similarly, the signal line $250_2$ includes an end portion $251_2$ and an end portion $252_2$. The end portion $251_2$ is a first end portion formed in the X direction, and the end portion $252_2$ is a second end portion formed in the X direction and opposite to the end portion $251_2$. The semiconductor device 100B includes terminals $101_1$ and $101_2$ that output a differential signal. The terminal $101_1$ is connected to the end portion $251_1$ of the signal line $250_1$, and the terminal $101_2$ is connected to the end portion $251_2$ of the signal line $250_2$. The transmission speed of the digital signal transmitted through the signal lines $250_1$ and $250_2$ is 1 Gbps or more. The material of the signal lines $250_1$ and $250_2$ contains electrically-conductive metal material such as copper or gold.

Figure 6A:
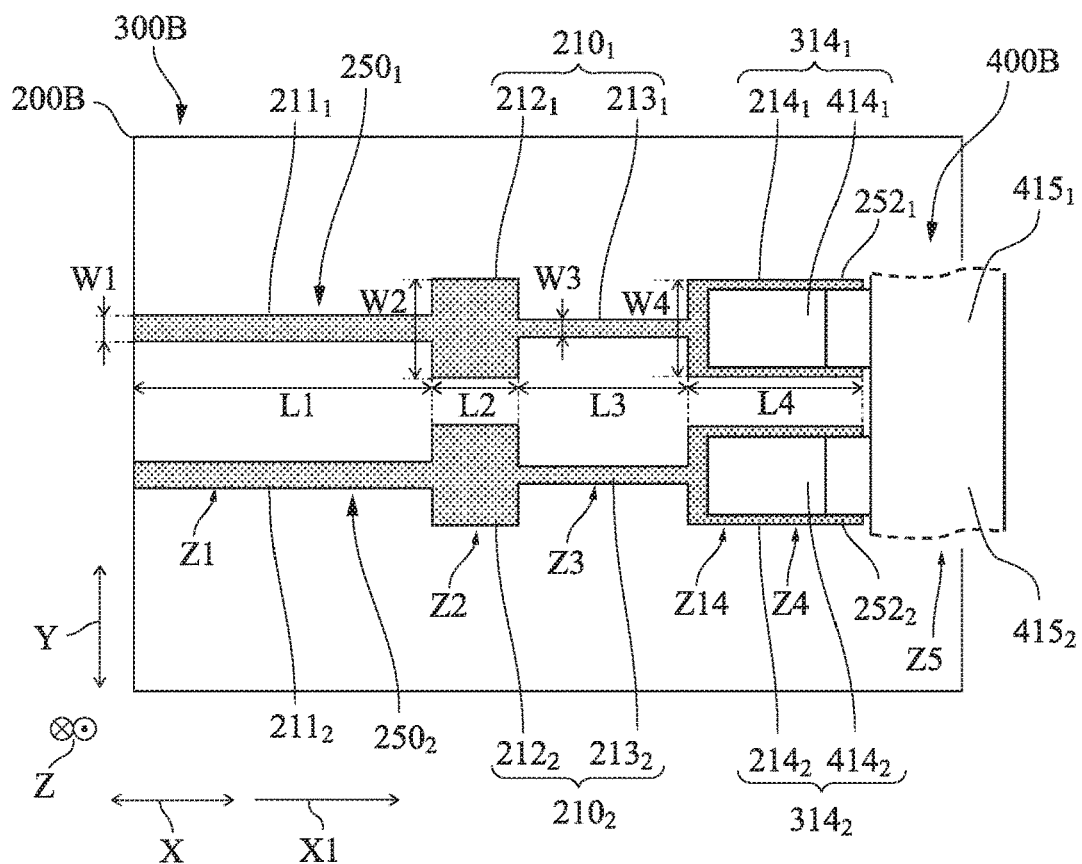
FIG. 6A is a plan view of one portion of the processing module of the third embodiment.
Figure 6B:
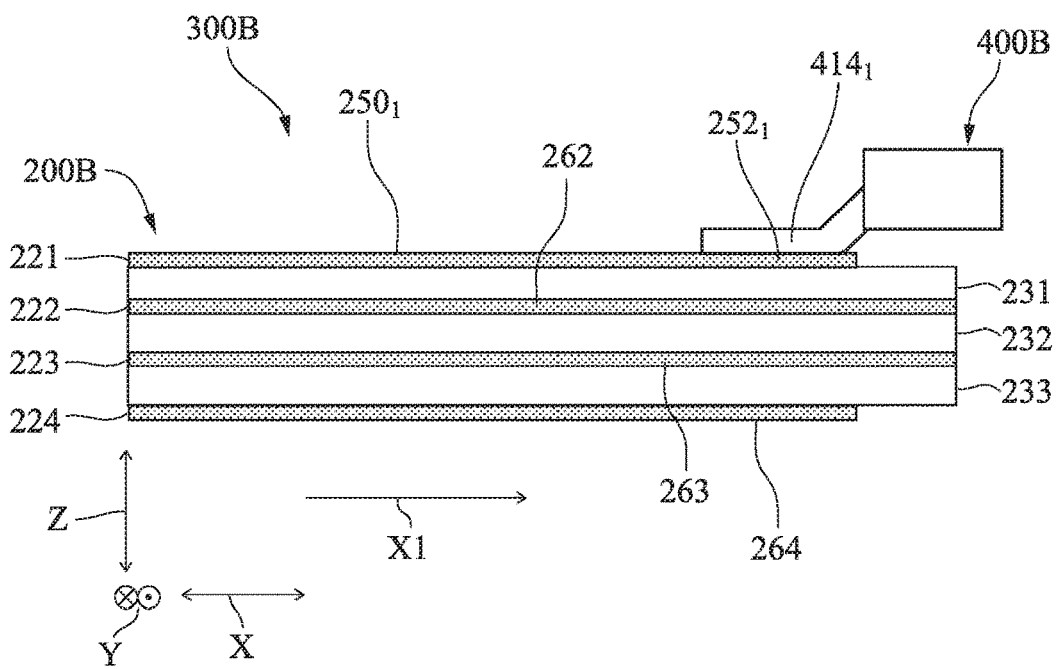
FIG. 6B is a sectional view of the one portion of the processing module of the third embodiment.

FIG. 6A is a plan view of one portion of the processing module 300B of the third embodiment. FIG. 6B is a sectional view of the one portion of the processing module 300B of the third embodiment. As in the first embodiment, the printed wiring board 200B includes four conductor layers 221, 222, 223, and 224, and insulator layers 231, 232, and 233. The conductor layers 221, 222, 223, and 224 are disposed such that each of the insulator layers 231, 232, and 233 is sandwiched between adjacent conductor layers.

In the third embodiment, the pair of the signal lines $250_1$ and $250_2$ is disposed in the conductor layer 221. In the conductor layer 222 adjacent to the conductor layer 221 via the insulator layer 231, a planar ground pattern 262 is disposed. In the conductor layer 223, a planar ground pattern 263 is disposed. In the conductor layer 224, a signal line 264 other than the signal lines $250_1$ and $250_2$ is disposed.

The connector 400B is a surface-mount electrical component, and includes a pair of terminals $414_1$ and $414_2$, which are signal terminals. The terminals $414_1$ and $414_2$ are pin-shaped. The terminal $414_1$ is connected to the end portion $252_1$ of the signal line $250_1$, and the terminal $414_2$ is connected to the end portion $252_2$ of the signal line $250_2$. The pair of the terminals $414_1$ and $414_2$ receives a differential signal. The transmission direction in which a differential signal is transmitted through the pair of the signal lines $250_1$ and $250_2$ is defined as an X1 direction.

The signal line $250_1$ includes line portions $211_1$, $212_1$, $213_1$, and $214_1$ formed continuously in the X direction. The signal line $250_2$ includes line portions $211_2$, $212_2$, $213_2$, and $214_2$ formed continuously in the X direction. The line portion $211_1$ and the line portion $211_2$ are adjacent to each other in the Y direction, spaced from each other. The line portion $212_1$ and the line portion $212_2$ are adjacent to each other in the Y direction, spaced from each other. The line portion $213_1$ and the line portion $213_2$ are adjacent to each other in the Y direction, spaced from each other. The line portion $214_1$ and the line portion $214_2$ are adjacent to each other in the Y direction, spaced from each other. The connector 400B includes a line portion $415_1$ that is continuous with the terminal $414_1$, and a line portion $415_2$ that is continuous with the terminal $414_2$.

Next, the signal line $250_1$ will be described. The line portion $211_1$ is a main line; and is longest in the X direction, in the line portions $211_1$ to $214_1$. The line portion $214_1$ is a pad that can be joined with the terminal $414_1$ of the connector $400_1$ via solder. When the line portion $214_1$ is joined with the terminal $414_1$, an integral structure $314_1$ is formed by the line portion $214_1$ and the terminal $414_1$. The line portion $214_1$, which is a pad, is rectangular when viewed from the Z direction. Since the signal line $250_2$ has the same structure as that of the signal line $250_1$, the description thereof will be omitted.

The differential impedance of the pair of the line portions $211_1$ and $211_2$ is denoted by Z1. The differential impedance of the pair of the line portions $212_1$ and $212_2$ is denoted by Z2. The differential impedance of the pair of the line portions $213_1$ and $213_2$ is denoted by Z3. The differential impedance of the pair of the line portions $414_1$ and $414_2$ is denoted by Z4. The differential impedance of the pair of the line portions $415_1$ and $415_2$ is denoted by Z5. In addition, the differential impedance of the pair of the line portions $214_1$ and $214_2$ with which the terminals are not joined is denoted by Z14. The differential impedance Z1 corresponds to the first characteristic impedance, the differential impedance Z2 corresponds to the second characteristic impedance, and the differential impedance Z3 corresponds to the third characteristic impedance. In addition, the differential impedance Z4 corresponds to the fourth characteristic impedance, and the differential impedance Z5 corresponds to the fifth characteristic impedance.

A line width of each of the line portions $211_1$ and $211_2$ in the Y direction is denoted by W1, a line width of each of the line portions $212_1$ and $212_2$ in the Y direction is denoted by W2, a line width of each of the line portions $213_1$ and $213_2$ in the Y direction is denoted by W3, and a line width of each of the line portions $214_1$ and $214_2$ in the Y direction is denoted by W4. In addition, a length of each of the line portions $211_1$ and $211_2$ in the X direction is denoted by L1, a length of each of the line portions $212_1$ and $212_2$ in the X direction is denoted by L2, a length of each of the line portions $213_1$ and $213_2$ in the X direction is denoted by L3, and a length of each of the line portions $214_1$ and $214_2$ in the X direction is denoted by L4.

The line width W4 is larger than the line width W1. Thus, the differential impedance Z14 is lower than the differential impedance Z1. In addition, when the terminals $414_1$ and $414_2$ of the connector 400B are joined with the line portions $214_1$ and $214_2$, the differential impedance Z4 of the integral structures $314_1$ and $314_2$ is lower than the differential impedance Z14 of only the line portions $214_1$ and $214_2$. Thus, the difference, Z1-Z4, between the differential impedance Z1 and the differential impedance Z4 is larger than the difference, Z1-Z14, between the differential impedance Z1 and the differential impedance Z14.

As in the first embodiment, a control line portion $210_1$, formed by the line portion $212_1$ and the line portion $213_1$, is disposed between the line portion $211_1$ and the line portion $214_1$. Similarly, a control line portion $210_2$, formed by the line portion $212_2$ and the line portion $213_2$, is disposed between the line portion $211_2$ and the line portion $214_2$. The pair of the control line portions $210_1$ and $210_2$ is disposed for controlling the disturbance of voltage of a differential signal, caused by the difference, Z1-Z4, between the differential impedance Z1 and the differential impedance Z4.

In the third embodiment, the line portions $211_1$ to $214_1$ and the line portions $211_2$ to $214_2$ have an identical thickness in the Z direction. The line width W2 is larger than the line width W1. Thus, the differential impedance Z2 is lower than the differential impedance Z1. The line width W3 is smaller than the line width W1. Thus, the differential impedance Z3 is higher than the differential impedance Z1. In this structure, the decrease in differential impedance in the integral structures $314_1$ and $314_2$ is suppressed by the line portions $213_1$ and $213_2$, whose differential impedance is higher than that of the integral structures $314_1$ and $314_2$. Furthermore, the increase in differential impedance in the line portions $213_1$ and $213_2$ is suppressed by the line portions $212_1$ and $212_2$, whose differential impedance is lower than that of the line portions $213_1$ and $213_2$. In this manner, the reflection of signals caused by the integral structures $314_1$ and $314_2$ is reduced, so that the disturbance of voltage of a differential signal, that is, the difference between a maximum peak value and a minimum peak value is reduced. Therefore, the quality of the differential signal transmitted through the lines improves.

The differential impedance Z2 may be equal to or lower than the differential impedance Z4. The differential impedance Z2 is preferably higher than the differential impedance Z4 for stabilizing the voltage of the differential signal transmitted through the lines. The differential impedance Z3 may be equal to or higher than the differential impedance Z5. The differential impedance Z3 is preferably lower than the differential impedance Z5 for stabilizing the voltage of the differential signal transmitted through the lines.

Fourth Embodiment

Figure 7A:
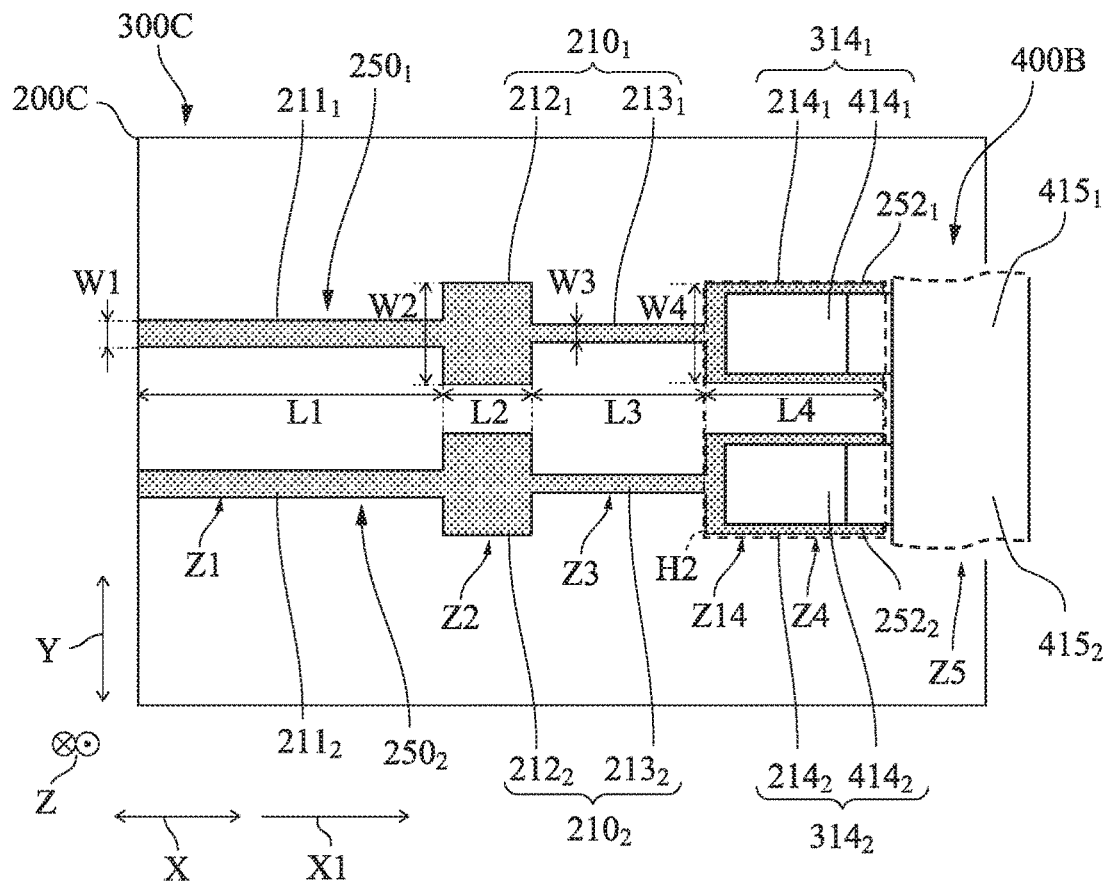
FIG. 7A is a plan view of one portion of a processing module of a fourth embodiment.
Figure 7B:
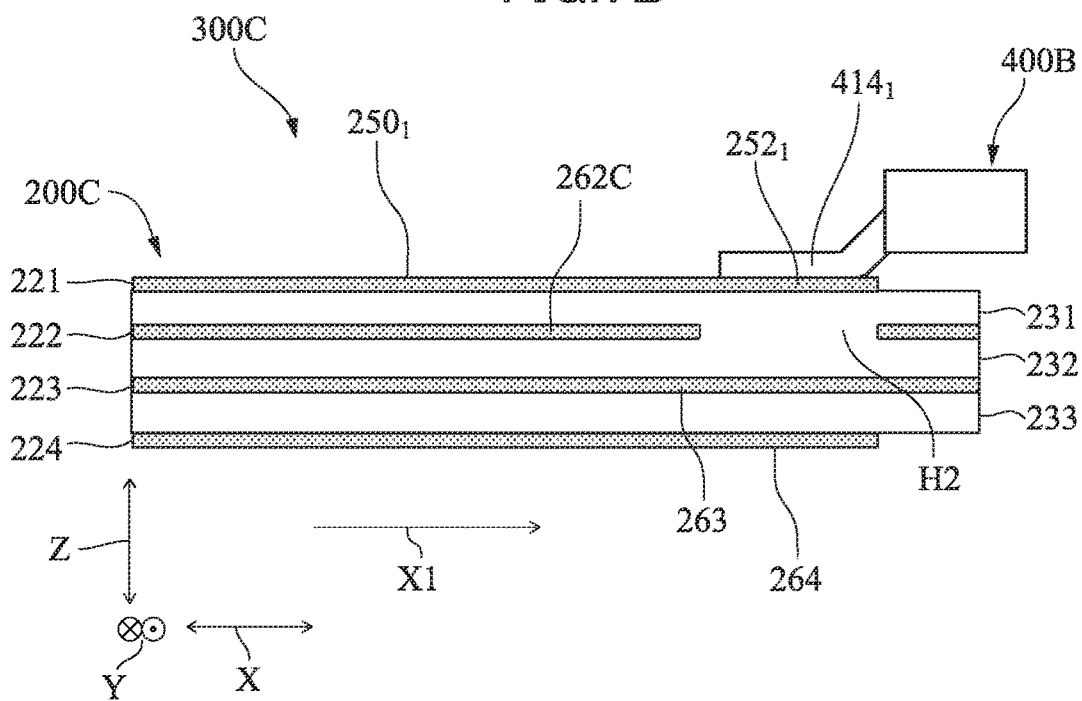
FIG. 7B is a sectional view of the one portion of the processing module of the fourth embodiment.

Next, a configuration of a digital camera that is one example of an electronic device of a fourth embodiment will be described. In the fourth embodiment, a configuration of a processing module of the digital camera is different from that of the third embodiment. For this reason, the processing module will be described. FIG. 7A is a plan view of one portion of a processing module 300C of the fourth embodiment. FIG. 7B is a sectional view of the one portion of the processing module 300C of the fourth embodiment. In the fourth embodiment, a component identical to a component of the third embodiment is given an identical symbol, and the description thereof will be omitted.

The processing module 300C, which is one example of a printed circuit board, includes a printed wiring board 200C and a connector 400B mounted on the printed wiring board 200C. As in the third embodiment, the processing module 300C includes the semiconductor device 100B of FIG. 5 (the semiconductor device 100B is not illustrated in FIGS. 7A and 7B). The semiconductor device 100B is mounted on the printed wiring board 200C.

As in the third embodiment, the printed wiring board 200C includes four conductor layers 221, 222, 223, and 224, and insulator layers 231, 232, and 233. The conductor layers 221, 222, 223, and 224 are disposed such that each of the insulator layers 231, 232, and 233 is sandwiched between adjacent conductor layers.

In the fourth embodiment, as in the third embodiment, signal lines $250_1$ and $250_2$ are disposed in the conductor layer 221. In the conductor layer 222, a planar ground pattern 262C is disposed. The ground pattern 262C is different from the ground pattern 262 (FIG. 6B) of the third embodiment.

The ground pattern 262C includes an opening H2. In a plan view of the printed wiring board 200C, that is, when viewed from the Z direction, the opening H2 overlaps with at least one portion of the line portions $214_1$ and $214_2$. In the fourth embodiment, when viewed from the Z direction, the opening H2 overlaps with the whole of the pair of the line portions $214_1$ and $214_2$.

Since the opening H2 is formed in the ground pattern 262C, the differential impedance Z4 of the pair of the integral structures $314_1$ and $314_2$ of the fourth embodiment is higher than the differential impedance Z4 of the pair of the integral structures $314_1$ and $314_2$ of the third embodiment. That is, in the fourth embodiment, the difference between the differential impedance Z1 and the differential impedance Z4 can be made smaller than that in the third embodiment. Therefore, the quality of the differential signal further improves.

EXAMPLES

Hereinafter, lines for single-ended signals will be described in Example 1, Example 2, and Comparative Example 1, and lines for differential signals will be described in Example 3, Example 4, and Comparative Example 2.

Example 1

With reference to FIGS. 3A and 3B, Example 1 will be described. Example 1 indicates specific numerical values of the first embodiment. For achieving the relationship of characteristic impedance of Z4<Z2<Z1<Z3<Z5, the printed circuit board was designed by using a simulation device and the following parameters, and characteristic impedances were calculated. For calculating the characteristic impedances, HyperLynx made by Mentor was used.

The thickness of the conductor layer 221 was set at 37 μm. The thickness of the conductor layer 222 was set at 35 μM. The thickness of the conductor layer 223 was set at 35 μm. The thickness of the conductor layer 224 was set at 37 μm. The thickness of the insulator layer 231 was set at 100 μm. The thickness of the insulator layer 232 was set at 1200 μm. The thickness of the insulator layer 233 was set at 100 μm. The relative dielectric constant of the insulator layers 231, 232, and 233 was set at 4.3, and the dielectric tangent of the insulator layers 231, 232, and 233 was set at 0.02. In addition, surfaces of the conductor layers 221 and 224 are covered with solder resist (not illustrated). The thickness of the solder resist (not illustrated) in the Z direction was set at 20 μm. The relative dielectric constant of the solder resist (not illustrated) was set at 3.0, and the dielectric tangent of the solder resist was set at 0.02.

The line width W1 of the line portion 211 in the Y direction was set at 150 μm, and the length L1 of the line portion 211 in the X direction was set at 28.6 mm. The line width W2 of the line portion 212 in the Y direction was set at 280 μm, and the length L2 of the line portion 212 in the X direction was set at 0.4 mm. The line width W3 of the line portion 213 in the Y direction was set at 85 μm, and the length L3 of the line portion 213 in the X direction was set at 1.0 mm. The line width W4 of the line portion 214 in the Y direction was set at 250 μm, and the length L4 of the line portion 214 in the X direction was set at 2.0 mm.

The width of the terminal 414, joined with the line portion 214, in the Y direction was set at 250 μm, and the length of the terminal 414 in the X direction was set at 2.0 mm. The thickness of the terminal 414 in the Z direction was set at 200 μm. The length of the line portion 415 in the X direction was set at 2.0 mm. In addition, a signal output portion of the line portion 415 was terminated by a resistor of 50Ω (not illustrated).

After performing the calculation under the above-described conditions, the following characteristic impedances Z1 to Z4 were obtained. The characteristic impedance Z1 was 50.8Ω. The characteristic impedance Z2 was 36.4Ω. The characteristic impedance Z3 was 64.2Ω. The characteristic impedance Z4 was 36.1Ω. The characteristic impedance Z5 was 65Ω. Although the width of the integral structure 314, formed by the line portion 214 and the terminal 414, is smaller than the width of the line portion 212, the characteristic impedance Z4 was lower than the characteristic impedance Z2. The characteristic impedance Z14 was 40.3Ω.

Figure 8A:
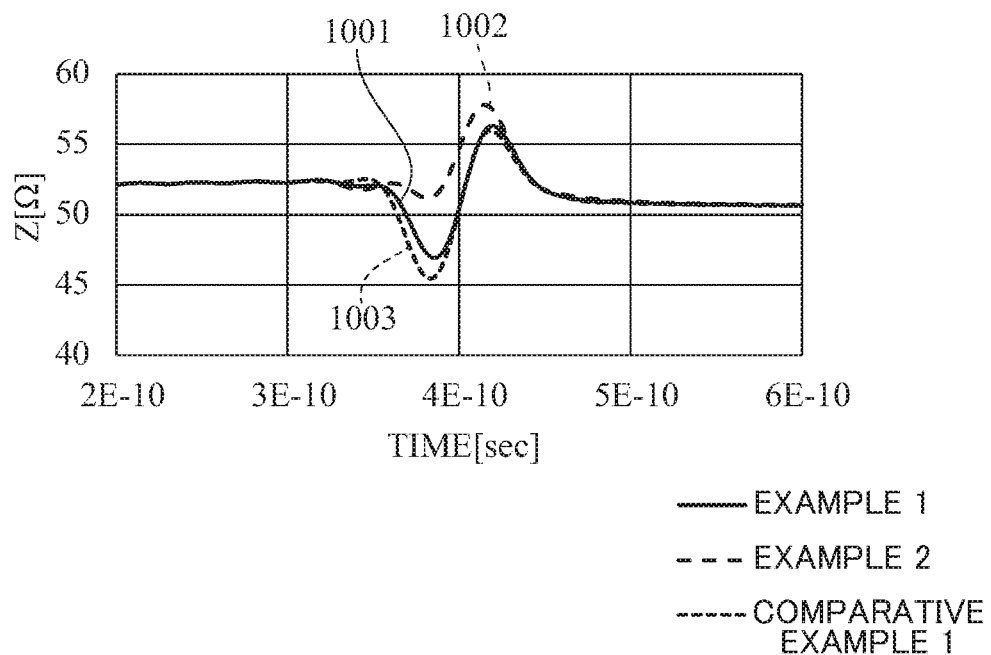
FIG. 8A is a graph illustrating a simulation result obtained in examples.

In addition, a time domain reflectometry (TDR) analysis simulation was performed on the structure of Example 1. FIG. 8A is a graph illustrating a simulation result obtained in examples. In FIG. 8A, the vertical axis represents the characteristic impedance (Ω), and the horizontal axis represents the time (sec). The TDR analysis can determine a characteristic impedance of a signal line at a position separated from a signal source by a certain distance. In addition, the TDR analysis can evaluate the quality of voltage waveform of a digital signal.

In FIG. 8A, a waveform 1001 indicates a TDR analysis result obtained in Example 1. For the TDR analysis, HSPICE made by Synopsys, Inc. was used. In addition, a pulse signal was used as a digital signal that will be applied to the signal line.

Figure 8B:
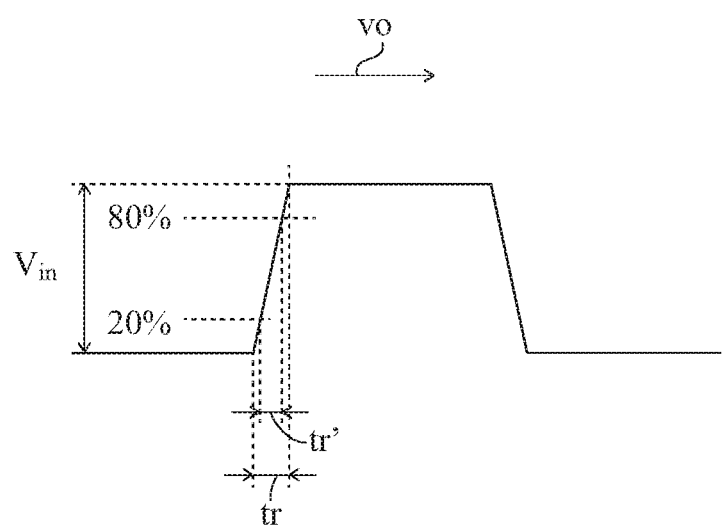
FIG. 8B is a diagram illustrating a signal used in the examples.

FIG. 8B is a diagram illustrating the pulse signal applied from the signal source to one end of a main line in the examples. In Example 1, the main line is the line portion 211. The one end of the main line is the end portion 251 illustrated in FIG. 2. The signal source corresponds to the semiconductor device 100 illustrated in FIG. 2. The voltage magnitude of the pulse signal applied to the line portion 211 is denoted by $V_{in}$, and the rise time of the pulse signal is denoted by tr. The rise time tr corresponds to 0 to 100% of the voltage magnitude $V_{in}$. The voltage magnitude $V_{in}$ is 400 mV, and the rise time tr is 35 ps. The internal impedance of the signal source is 50Ω.

An analysis result in Example 1 will be described, comparing a TDR analysis result and a calculation result on characteristic impedance. In Example 1, the pulse signal was applied to the one end of the line portion 211. In the TDR analysis result, the characteristic impedance Z1 of the line portion 211 was 52Ω.

The characteristic impedance Z2 of the line portion 212 obtained by calculation was 36.4Ω, which is lower than the characteristic impedance Z1 of the line portion 211. The characteristic impedance Z3 of the line portion 213 was 64.2Ω, which is higher than the characteristic impedance Z1. The characteristic impedance Z4 of the integral structure 314 was 36.1Ω, which is lower than the characteristic impedance Z1.

The length L1 of the line portion 211 in the X direction was set at 28.6 mm. The relative dielectric constant of a solder resist formed on the line portion 211 was set at 3, and the relative dielectric constant of an insulator formed on the line portion 211 was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about $1.654 \times 10^8$ m/s, which is about 0.551 times the light speed ($\approx 3.0 \times 10^8$ m/s). Thus, the time in which the signal propagates through the line portion 211 is 172.9 ps.

The length L2 of the line portion 212 in the X direction was set at 0.4 mm. The relative dielectric constant of a solder resist formed on the line portion 212 was set at 3, and the relative dielectric constant of an insulator formed on the line portion 212 was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The electromagnetic wave was determined as about $1.617 \times 10^8$ m/s, which is about 0.539 times the light speed ($\approx 3.0 \times 10^8$ m/s). Thus, the time in which the signal propagates through the line portion 212 is 2.5 ps.

The characteristic impedance decreases to 36.4Ω in the rise time tr (i.e. 35 ps) of the pulse signal. In the line portion 212, however, the signal wave makes a round trip in 5.0 ps (=2.5×2). Thus, the effective change from the internal impedance (50Ω) of the signal source to the characteristic impedance Z2 (36.4Ω) of the line portion 212 is −1.91Ω (≈(36.4−50)×(5.0/35)).

The length L3 of the line portion 213 in the X direction was set at 1.0 mm. The relative dielectric constant of a solder resist formed on the line portion 213 was set at 3, and the relative dielectric constant of an insulator formed on the line portion 213 was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about $1.681 \times 10^8$ m/s, which is about 0.560 times the light speed ($\approx 3.0 \times 10^8$ m/s). Thus, the time in which the signal propagates through the line portion 213 is 5.9 ps.

The characteristic impedance decreases to 64.2Ω in the rise time tr (i.e. 35 ps) of the pulse signal. In the line portion 213, however, the signal wave makes a round trip in 11.8 ps (=5.9×2). Thus, the effective change from the internal impedance (50Ω) of the signal source to the characteristic impedance Z3 (64.2Ω) of the line portion 213 is 4.8Ω (≈(64.2−50)×(11.8/35)).

The length of the integral structure 314 in the X direction was set at 2.0 mm Thus, the time in which the signal propagates through the integral structure 314 is 11.3 ps. The characteristic impedance decreases to 36.1Ω in the rise time tr (i.e. 35 ps) of the pulse signal. In the integral structure 314, however, the signal wave makes a round trip in 22.6 ps (=11.3×2). Thus, the effective change from the internal impedance (50Ω) of the signal source to the characteristic impedance Z4 (36.1Ω) of the integral structure 314 is −9.0Ω (≈(36.1−50)×(22.6/35)).

In Example 1, the line portion 211, the line portion 212, the line portion 213, and the integral structure 314 are continuously formed in this order, and the characteristic impedance changes at the line portion 211, the line portion 212, the line portion 213, and the integral structure 314. Thus, in the TDR analysis, the characteristic impedance of each line portion is obtained by adding the effective change in the line portion to a characteristic impedance of a preceding line portion. If the characteristic impedance Z1 of the line portion 211 obtained in the TDR analysis is added with the effective changes in the three line portions (obtained by calculation), the resultant value is calculated as 45.9Ω (=52−1.9+4.8−9.0), which is lower than the characteristic impedance Z1. In the TDR analysis, the value was 46.9Ω.

In the waveform 1001 illustrated in FIG. 8A, double the time in which the signal wave propagates through the line portion 211 is 345.8 ps; and a period of time from 0 to 345.8 ps corresponds to the line portion 211. In addition, double the time in which the signal wave propagates through the line portion 212 is 5 ps; and a period of time from 345.8 to 350.8 ps (=345.8+5) corresponds to the line portion 212. In addition, double the time in which the signal wave propagates through the line portion 213 is 10.8 ps; and a period of time from 350.8 to 361.6 ps (=350.8+10.8) corresponds to the line portion 213. Finally, double the time in which the signal wave propagates through the integral structure 314 is 22.6 ps; and a period of time from 361.6 to 384.2 ps (=361.6+22.6) corresponds to the integral structure 314. The characteristic impedance corresponding to 384.2 ps was 46.9Ω.

The characteristic impedance Z3 is higher than the characteristic impedance Z1. Preferably, the characteristic impedance Z3 is lower than the characteristic impedance Z5, which is highest in the characteristic impedance Z2, the characteristic impedance Z4, and the characteristic impedance Z5. The reason for this is to make a variation range of the characteristic impedance of the line portion 213 obtained by the TDR analysis, lower than the characteristic impedance Z5 that is highest in the circuit.

In addition, it is preferable that the length L3 of the line portion 213 in the X direction satisfies the following expression (1), $$L3 = \frac{1}{2} \times tr \times vo \times \frac{Z1 \times 0.10}{Z5 - Z1} \quad (1)$$

where tr is a rise time of the digital signal, vo is a propagation velocity of the digital signal, Z1 is a characteristic impedance of the line portion 211, and Z5 is a characteristic impedance of the line portion 415.

The characteristic impedance of the line portion 211, which is a main line, is controlled so as to be about 50Ω. In the expression (1), a ratio is calculated by dividing the amount of variation of characteristic impedance (Z1×0.10) allowed in the line portion 213, by the difference, Z5−Z1, between the characteristic impedance of the line portion 211 and the characteristic impedance of the line portion 415. Then, the ratio is multiplied by half the rise time of the pulse signal and the propagation velocity. By this calculation, the length of the line portion 213 required to keep the quality of voltage waveform of the digital signal is determined. Note that the line portion 213 is the structure for suppressing the disturbance of voltage waveform of the digital signal caused in the integral structure 314, and that the characteristic impedance of the line portion 213 is determined such that any new disturbance is not produced by the line portion 213.

If a line has a length in which a round trip time of the electromagnetic wave is sufficiently longer than the rise time of the pulse signal, a characteristic impedance of the line can be measured in the TDR analysis after the rise time of the pulse signal has elapsed. In contrast, if a line has a length in which a round trip time of the electromagnetic wave is shorter than the rise time of the pulse signal, that is, if the line has a length shorter than a time resolution of the pulse signal, the characteristic impedance of the line does not change to a value obtained in the line that has a sufficient length. If Z3=Z5, a time in which the characteristic impedance changes by the amount of Z5−Z1 is equal to the rise time of the pulse signal. If the characteristic impedance Z3 is limited to Z1×0.10, the expression (1) is obtained.

In addition, for keeping the quality of voltage waveform of the digital signal, the board is often manufactured such that the amount of variation of characteristic impedance allowed in the line portion 213 is about ±5 to ±15% of the characteristic impedance of the main line. That is, in consideration of the amount of variation of characteristic impedance, it is preferable that the length L3 of the line portion 213 in the X direction satisfies the following expression (2).

$$\frac{1}{2} \times tr \times vo \times \frac{Z1 \times 0.05}{Z5 - Z1} \leq L3 \leq \frac{1}{2} \times tr \times vo \times \frac{Z1 \times 0.15}{Z5 - Z1} \quad (2)$$

The characteristic impedance Z2 is lower than the characteristic impedance Z1. Preferably, the characteristic impedance Z2 is higher than the characteristic impedance Z4, which is lowest in the characteristic impedance Z3, the characteristic impedance Z4, and the characteristic impedance Z5. The reason for this is to make a variation range of the characteristic impedance of the line portion 212 with respect to the characteristic impedance of the line portion 211 obtained by the TDR analysis, lower than the characteristic impedance of the integral structure 314.

In addition, it is preferable that the length L2 of the line portion 212 in the X direction satisfies the following expression (3).

$$L2 = \frac{1}{2} \times tr \times vo \times \frac{0.5 \times Z1 \times 0.10}{Z1 - Z4} \quad (3)$$

The characteristic impedance of the line portion 211, which is a main line, is controlled so as to be about 50Ω. In the expression (3), a ratio is calculated by dividing the amount of variation of characteristic impedance (Z1×0.10) allowed in the line portion 212, by the difference, Z1−Z4, between the characteristic impedance of the line portion 211 and the characteristic impedance of the integral structure 314. Then, the ratio is multiplied by half the rise time of the pulse signal and the propagation velocity. Finally, the length of the line portion 212 is determined by multiplying the resultant ratio by 0.5. Note that the line portion 212 is the structure for suppressing the disturbance of voltage waveform of the digital signal caused in the integral structure 314, and that the characteristic impedance of the line portion 212 is determined such that any new disturbance is not produced by the line portion 212.

Since the line portion 212 is disposed in front of the line portion 213, the increase of the characteristic impedance caused by the line portion 213 can be suppressed. However, if the characteristic impedance is excessively decreased by the line portion 212 disposed in front of the line portion 213, the difference between the characteristic impedance Z1 of the line portion 211 and the characteristic impedance Z4 of the integral structure 314, which is reduced by the line portion 213, increases again. Thus, in Example 1, the length of the line portion 212 is corrected. In the above-described expression (3), the correction coefficient is 0.5.

In addition, for keeping the quality of voltage waveform of the digital signal, the board is manufactured such that the amount of variation of characteristic impedance allowed in the line portion 212 is about ±5, ±10, or ±15% of the characteristic impedance of the main line. That is, in consideration of the amount of variation of characteristic impedance, it is preferable that the length L2 of the line portion 212 in the X direction satisfies the following expression (4).

$$\frac{1}{2} \times tr \times vo \times \frac{0.5 \times Z1 \times 0.05}{Z1 - Z4} \leq L2 \leq \frac{1}{2} \times tr \times vo \times \frac{0.5 \times Z1 \times 0.15}{Z1 - Z4} \quad (4)$$

It is preferable that the length L4 of the line portion 214 in the X direction satisfies the following expression (5).

$$L4 \leq \tfrac{1}{2} \times tr \times vo \quad (5)$$

If a line has a length in which a round trip time of the electromagnetic wave is sufficiently longer than the rise time of the pulse signal, a characteristic impedance of the line that is substantially the same as that of a line having an infinite length can be measured in the TDR analysis after the rise time of the pulse signal has elapsed. In contrast, if a line has a length in which a round trip time of the electromagnetic wave is shorter than the rise time of the pulse signal, that is, if the line has a length shorter than a time resolution of the pulse signal, the characteristic impedance of the line does not change to a value obtained in the line that has a sufficient length. If the line portion 214 has a length in which a round trip time of the electromagnetic wave is longer than the rise time of the pulse signal, the effect produced by the arrangement of the line portions 212 and 213 for suppressing the disturbance of voltage waveform of the digital signal caused in the integral structure 314 is not produced. Thus, the length L4 is determined as described above.

Example 2

With reference to FIGS. 4A and 4B, Example 2 will be described. Example 2 indicates specific numerical values of the second embodiment. First, characteristic impedances were calculated. For calculating the characteristic impedances, HyperLynx made by Mentor was used, as in Example 1. Hereinafter, numerical values of each component used for calculating the characteristic impedances will be described. A structure of each layer of the printed wiring board 200A of Example 2 is the same as that of Example 1. In the following description, the features of Example 2 different from those of Example 1 will be described.

The line width W1 of the line portion 211 in the Y direction was set at 150 µm, and the length L1 of the line portion 211 in the X direction was set at 28.2 mm. The line width W2 of the line portion 212 in the Y direction was set at 210 µm, and the length L2 of the line portion 212 in the X direction was set at 0.8 mm. The line width W3 of the line portion 213 in the Y direction was set at 85 µm, and the length L3 of the line portion 213 in the X direction was set at 1.0 mm. The line width W4 of the line portion 214 in the Y direction was set at 250 µm, and the length L4 of the line portion 214 in the X direction was set at 2.0 mm. The width of the opening H1 in the Y direction was set at 250 µm that is equal to the line width W4, and the length of the opening H1 in the X direction was set at 2.0 mm that is equal to the length L4. That is, the area of the line portion 214 is equal to the area of the opening H1.

The width of the terminal 414, joined with the line portion 214, in the Y direction was set at 250 µm, and the length of the terminal 414 in the X direction was set at 2.0 mm The thickness of the terminal 414 in the Z direction was set at 200 µm. The length of the line portion 415 in the X direction was set at 2.0 mm. In addition, a signal output portion of the line portion 415 was terminated by a resistor of 50Ω (not illustrated).

After performing the calculation under the above-described conditions, the following characteristic impedances Z1 to Z4 were obtained. The characteristic impedance Z1 was 50.8Ω. The characteristic impedance Z2 was 42.9Ω. The characteristic impedance Z3 was 64.2Ω. The characteristic impedance Z4 was 42.6Ω. The characteristic impedance Z5 was 65Ω. Thus, the relationship of the characteristic impedances was Z4<Z2<Z1<Z3<Z5. The width of the integral structure 314, formed by the line portion 214 and the terminal 414, is larger than the width of the line portion 212, and the characteristic impedance Z4 was lower than the characteristic impedance Z2. The characteristic impedance Z14 was 48.8Ω.

Note that in Example 2, although the description has been made for the case where the line width W3 is set at 85 µM so that the characteristic impedance Z3 of the line portion 213 becomes 64.2Ω, the present disclosure is not limited to this. For example, a slit may be formed in the ground pattern 262A that faces the line portion 213. In this case, if the line width W3 is 100 µm, and a slit is formed in the ground pattern 262A at a position that faces the line portion 213, the characteristic impedance Z3 becomes 62.8Ω.

In addition, the TDR analysis simulation was performed on the structure of Example 2. In FIG. 8A, a waveform 1002 indicates a TDR analysis result obtained in Example 2. For the TDR analysis, HSPICE made by Synopsys, Inc. was used, as in Example 1. In addition, a pulse signal was used as a digital signal that will be applied to the signal line. The pulse signal is the same as that used in Example 1.

An analysis result in Example 2 will be described, comparing a TDR analysis result and a calculation result on characteristic impedance. In Example 2, the pulse signal was applied to the one end of the line portion 211. In the TDR analysis result in Example 2, the characteristic impedance Z1 of the line portion 211 was 52Ω.

The characteristic impedance Z2 of the line portion 212 obtained by calculation was 42.9Ω, which is lower than the characteristic impedance Z1 of the line portion 211. The characteristic impedance Z3 of the line portion 213 was 64.2Ω, which is higher than the characteristic impedance Z1 of the line portion 211. The characteristic impedance Z4 of the integral structure 314 was 42.6Ω, which is lower than the characteristic impedance Z1. When viewed from the Z direction, the line portion 214 overlaps with the opening H1 of the ground pattern 262A. Thus, the characteristic impedance Z4 is higher than the characteristic impedance Z4 of Example 1.

The length L1 of the line portion 211 in the X direction was set at 28.2 mm. The relative dielectric constant of a solder resist formed on the line portion 211 was set at 3, and the relative dielectric constant of an insulator formed on the line portion 211 was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about $1.654 \times 10^8$ m/s, which is about 0.551 times the light speed ($\approx 3.0 \times 10^8$ m/s). Thus, the time in which the signal propagates through the line portion 211 is 170.4 ps.

The length L2 of the line portion 212 in the X direction was set at 0.8 mm. The relative dielectric constant of a solder resist formed on the line portion 212 was set at 3, and the relative dielectric constant of an insulator formed on the line portion 212 was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about $1.635 \times 10^8$ m/s, which is about 0.545 times the light speed ($\approx 3.0 \times 10^8$ m/s). Thus, the time in which the signal propagates through the line portion 212 is 4.9 ps. The characteristic impedance decreases to 42.9Ω in the rise time tr (i.e. 35 ps) of the pulse signal. In the line portion 212, however, the signal wave makes a round trip in 9.8 ps (=4.9×2). Thus, the effective change from the internal impedance (50Ω) of the signal source to the characteristic impedance Z2 (42.9Ω) of the line portion 212 is −2.0Ω ($\approx$(42.9-50)×(9.8/35)).

The length L3 of the line portion 213 in the X direction was set at 1.0 mm. The relative dielectric constant of a solder resist formed on the line portion 213 was set at 3, and the relative dielectric constant of an insulator formed on the line portion 213 was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about $1.681 \times 10^8$ m/s, which is about 0.560 times the light speed ($\approx 3.0 \times 10^8$ m/s). Thus, the time in which the signal propagates through the line portion 213 is 6.0 ps. The characteristic impedance increases to 64.2 Ω in the rise time tr (i.e. 35 ps) of the pulse signal. In the line portion 213, however, the signal wave makes a round trip in 12 ps (=6.0×2). Thus, the effective change from the internal impedance (50Ω) of the signal source to the characteristic impedance Z3 (64.2Ω) of the line portion 213 is 4.9Ω ($\approx$(64.2-50)×(12/35)).

The length of the integral structure 314 in the X direction was set at 2.0 mm. The relative dielectric constant of air on the integral structure 314 was set at 1, and the relative dielectric constant of an insulator formed on the integral structure 314 was set at 4.3. The propagation velocity of the electromagnetic wave was calculated using the relative dielectric constant of the air and the relative dielectric constant of the insulator. For calculating the propagation velocity of the electromagnetic wave, HyperLynx made by Mentor was used. The propagation velocity of the electromagnetic wave was determined as about $1.835 \times 10^8$ m/s, which is about 0.612 times the light speed ($\approx 3.0 \times 10^8$ m/s). Thus, the time in which the signal propagates through the integral structure 314 is 10.9 ps. The characteristic impedance decreases to 42.6Ω in the rise time tr (i.e. 35 ps) of the pulse signal. In the integral structure 314, however, the signal wave makes a round trip in 21.8 ps (=10.9×2). Thus, the effective change from the internal impedance (50Ω) of the signal source to the characteristic impedance Z4 (36.1Ω) of the integral structure 314 is −4.6Ω ($\approx$(42.6−50)×(21.8/35)).

In Example 2, the line portion 211, the line portion 212, the line portion 213, and the integral structure 314 are continuously formed in this order, and the characteristic impedance changes at the line portion 211, the line portion 212, the line portion 213, and the integral structure 314. Thus, in the TDR analysis, the characteristic impedance of each line portion is obtained by adding the effective change in the line portion to a characteristic impedance of a preceding line portion. If the characteristic impedance Z1 of the line portion 211 obtained in the TDR analysis is added with the effective changes in the three line portions (obtained by calculation), the resultant value is calculated as 50.3Ω (=52−2.0+4.9−4.6), which is lower than the characteristic impedance Z1. In the TDR analysis, the value was 51.2Ω.

In the waveform 1002 illustrated in FIG. 8A, double the time in which the signal wave propagates through the line portion 211 is 340.8 ps; and a period of time from 0 to 340.8 ps corresponds to the line portion 211. In addition, double the time in which the signal wave propagates through the line portion 212 is 9.8 ps; and a period of time from 340.8 to 350.6 ps (=340.8+9.8) corresponds to the line portion 212. In addition, double the time in which the signal wave propagates through the line portion 213 is 12 ps; and a period of time from 350.6 to 362.6 ps (=350.6+12) corresponds to the line portion 213. Finally, double the time in which the signal wave propagates through the integral structure 314 is 21.8 ps; and a period of time from 362.6 to 384.4 ps (=362.6+21.8) corresponds to the integral structure 314. The characteristic impedance corresponding to 384.4 ps was 51.2Ω.

Comparative Example 1

Specific numerical values of Comparative Example 1 will be described. First, characteristic impedances were calculated. For calculating the characteristic impedances, HyperLynx made by Mentor was used. Hereinafter, numerical values of each component used for calculating the characteristic impedances will be described. A structure of each layer of the printed wiring board 200X of Comparative Example 1 is the same as that of Example 1. In the following description, the features of Comparative Example 1 different from those of Example 1 will be described.

The line width W1X of the line portion 211X in the Y direction was set at 150 μm, and a length L1X of the line portion 211X in the X direction was set at 30 mm. The line width W4X of the line portion 214X (that is a pad) in the Y direction was set at 250 μm, and a length L4X of the line portion 214X in the X direction was set at 2.0 mm. The other numerical values are the same as those of Example 1. A characteristic impedance Z1X of the line portion 211X was 50.8Ω. A characteristic impedance Z4X of the line portion 214X was 36.1Ω.

In addition, the TDR analysis simulation was performed on the structure of Comparative Example 1. In FIG. 8A, a waveform 1003 indicates a TDR analysis result in Comparative Example 1. For the TDR analysis, HSPICE made by Synopsys, Inc. was used, as in Example 1 and Example 2. In addition, a pulse signal was used as a digital signal that will be applied to the signal line. The pulse signal is the same as that used in Example 1 and Example 2.

An analysis result in Comparative Example 1 will be described. In Comparative Example 1, the pulse signal was applied to the one end of the line portion 211X. In the TDR analysis result in Comparative Example 1, the characteristic impedance Z1X of the line portion 211X was 52Ω. The characteristic impedance Z4X of the integral structure 314X is lower than the characteristic impedance Z1X of the line portion 211X. Thus, in the TDR analysis result, as illustrated by the waveform 1003 of FIG. 8A, when the pulse signal reached the integral structure 314X, the characteristic impedance decreased to about 45Ω.

The length L1X of the line portion 211X in the X direction was set at 30 mm. The relative dielectric constant of a solder resist formed on the line portion 211X was set at 3, and the relative dielectric constant of an insulator formed on the line portion 211X was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about $1.654 \times 10^8$ m/s, which is about 0.551 times the light speed ($\approx 3.0 \times 10^8$ m/s). Thus, the time in which the signal propagates through the line portion 211X is 181.3 ps.

In addition, the length of the integral structure 314X in the X direction was set at 2.0 mm. The relative dielectric constant of air on the integral structure 314X was set at 1, and the relative dielectric constant of an insulator formed on the integral structure 314X was set at 4.3. The propagation velocity of the electromagnetic wave was calculated using the relative dielectric constant of the air and the relative dielectric constant of the insulator. For calculating the propagation velocity of the electromagnetic wave, HyperLynx made by Mentor was used. The propagation velocity of the electromagnetic wave was determined as about $1.772 \times 10^8$ m/s, which is about 0.591 times the light speed ($\approx 3.0 \times 10^8$ m/s). Thus, the time in which the signal propagates through the integral structure 314X is 11.3 ps.

Thus, the propagation time (11.3 ps) of the signal that corresponds to the length of the integral structure 314X is shorter than the resolution that is the rise time tr (i.e. 35 ps) of the signal applied to the integral structure 314X. Thus, the signal reaches the line portion 415 of the connector 400 before the characteristic impedance obtained by the TDR analysis decreases to the actual characteristic impedance Z4X (36.1Ω).

Hereinafter, specific calculation and a TDR analysis result will be described. The characteristic impedance decreases to 36.1Ω in the rise time tr (i.e. 35 ps) of the pulse signal. In the integral structure 314X, however, the signal wave makes a round trip in 22.6 ps (=11.3×2). Thus, the effective change from the internal impedance (50Ω) of the signal source to the characteristic impedance (36.1Ω) of the integral structure 314X is −9.0Ω ($\approx$(36.1−50)×(22.6/35)). Thus, in the calculation, the characteristic impedance decreased to 43.0Ω (=52−9.0). In the TDR analysis, the characteristic impedance decreased to 45.4Ω.

In the waveform 1003 illustrated in FIG. 8A, double the time in which the signal wave propagates through the line portion 211X is 362.6 ps; and a period of time from 0 to 362.6 ps corresponds to the line portion 211X. In addition, double the time in which the signal wave propagates through the integral structure 314X is 22.6 ps; and a period of time from 362.6 to 385.2 ps (=362.6+22.6) corresponds to the integral structure 314X. The characteristic impedance corresponding to 385.2 ps was 45.4Ω.

Comparison Between Example 1, Example 2, and Comparative Example 1

As the result of the above-described TDR analysis, in Example 1, the change of the characteristic impedance of the integral structure 314 to the characteristic impedance of the line portion 211 is lower than that in Comparative Example 1. The reason the change of the characteristic impedance of the integral structure 314 is lower in the TDR analysis is that the line portions 212 and 213 are disposed between the line portion 211 and the integral structure 314 to correct the mismatch of impedance between the line portion 211 and the integral structure 314. Similar to the pulse signal used in the TDR analysis, a digital signal outputted from the semiconductor device 100 to the signal line 250 also rises from a voltage of 0 V to the voltage $V_{in}$ in the rise time tr. Thus, similar to the pulse signal used in the TDR analysis, the digital signal transmitted through the signal line 250 is reflected less from the integral structure 314. Therefore, the quality of the digital signal transmitted through the signal line 250 to the connector 400 improves.

In addition, as the result of the above-described TDR analysis, in Example 2, the change of the characteristic impedance of the integral structure 314 to the characteristic impedance of the line portion 211 is lower than that in Comparative Example 1. The reason the change of the characteristic impedance of the integral structure 314 is lower in the TDR analysis is that the line portions 212 and 213 are disposed between the line portion 211 and the integral structure 314 to correct the mismatch of impedance between the line portion 211 and the integral structure 314. Similar to the pulse signal used in the TDR analysis, a digital signal outputted from the semiconductor device 100 to the signal line 250 also rises from a voltage of 0 V to the voltage $V_{in}$ in the rise time tr. Thus, similar to the pulse signal used in the TDR analysis, the digital signal transmitted through the signal line 250 is reflected less from the integral structure 314. Therefore, the quality of the digital signal transmitted through the signal line 250 to the connector 400 improves.

In the above description, the simulation for the characteristic impedances has been described. For measuring the characteristic impedance of the signal line 250 of an actual printed wiring board, a TDR oscilloscope is used. In this measurement, a step pulse having a voltage magnitude of $V_{in}$ and a rise time tr of 35 ps is sent to one end of the line portion 211 via a probe connected to the TDR oscilloscope. If there is a mismatch point of characteristic impedance, the signal reflects off the mismatch point and returns to the probe, via which the signal is sent to the one end of the line portion 211. Thus, a reflection voltage is added to a voltage of a signal observed at the probe. The characteristic impedance of the signal line 250 can be calculated from the observed voltage.

If a voltage of an observation point is denoted by Vr and the output impedance of the TDR oscilloscope is 50Ω, a characteristic impedance Z0 of the signal line 250 is calculated by using the following expression (6).

$$Z0 = \frac{1 + \frac{Vr - Vin}{Vin}}{1 - \frac{Vr - Vin}{Vin}} \times 50 \qquad (6)$$

In addition, the propagation velocity vo of a signal transmitted through the signal line 250 is obtained by calculating a period of time measured between changing points of characteristic impedance observed on the TDR oscilloscope and multiplying the period of time by 0.5.

For measuring a rise time of a pulse signal outputted from a transmission circuit (not illustrated), an oscilloscope is used. First, a waveform of a voltage of one end of the line portion 211 connected to the transmission circuit (not illustrated) is measured by using a probe. In this measurement, a period of time in which the voltage changes from 20% of the voltage magnitude $V_{in}$ to 80% of the voltage magnitude $V_{in}$ is measured. The voltage magnitude $V_{in}$ is obtained from the matching condition of characteristic impedance. For example, if the voltage magnitude $V_{in}$ is 400 mV in a matched state, a period of time corresponding to a voltage change of 240 mV is measured. If the period of time is denoted by tr', the relationship between the period of time tr' and the rise time tr is expressed by the following expression.

$tr=tr'/0.6$

Note that the characteristic impedance may be measured by another method other than the TDR analysis. For example, the characteristic impedance may be obtained by cutting a board, measuring a size of a cross section (i.e. thickness and width) of a line, measuring a dielectric constant of the material and a conductivity of the conductor, and calculating the characteristic impedance by using an electromagnetic field simulator.

Example 3

With reference to FIGS. 6A and 6B, Example 3 will be described. Example 3 indicates specific numerical values of the third embodiment. First, differential impedances were calculated. For calculating the differential impedances, HyperLynx made by Mentor was used. Hereinafter, numerical values of each component used for calculating the differential impedances will be described.

The thickness of the conductor layer 221 was set at 37 μm. The thickness of the conductor layer 222 was set at 35 μm. The thickness of the conductor layer 223 was set at 35 μm. The thickness of the conductor layer 224 was set at 37 μm. The thickness of the insulator layer 231 was set at 100 μm. The thickness of the insulator layer 232 was set at 1200 μm. The thickness of the insulator layer 233 was set at 100 μm. The relative dielectric constant of the insulator layers 231, 232, and 233 was set at 4.3, and the dielectric tangent of the insulator layers 231, 232, and 233 was set at 0.02. In addition, surfaces of the conductor layers 221 and 224 are covered with solder resist (not illustrated). The thickness of the solder resist (not illustrated) in the Z direction was set at 20 μm. The relative dielectric constant of the solder resist (not illustrated) was set at 3.0, and the dielectric tangent of the solder resist was set at 0.02.

The line width W1 of each of the line portions $211_1$ and $211_2$ in the Y direction was set at 100 μm, and the length L1 of each of the line portions $211_1$ and $211_2$ in the X direction was set at 28.34 mm. The clearance between the line portions $211_1$ and $211_2$ was set at 135 μm. The line width W2 of each of the line portions $212_1$ and $212_2$ in the Y direction was set at 300 μm, and the length L2 of each of the line portions $212_1$ and $212_2$ in the X direction was set at 0.37 mm. The clearance between the line portions $212_1$ and $212_2$ was set at 150 μm. The line width W3 of each of the line portions $213_1$ and $213_2$ in the Y direction was set at 90 μm, and the length L3 of each of the line portions $213_1$ and $213_2$ in the X direction was set at 1.29 mm. The clearance between the line portions $213_1$ and $213_2$ was set at 410 μm. The line width W4 of each of the line portions $214_1$ and $214_2$ in the Y direction was set at 250 μm, and the length L4 of each of the line portions $214_1$ and $214_2$ in the X direction was set at 2.0 mm. The clearance between the line portions $214_1$ and $214_2$ was set at 250 μm. The width of each of the terminals $414_1$ and $414_2$ in the Y direction was set at 250 μm, and the length of each of the terminals $414_1$ and $414_2$ in the X direction was set at 2.0 mm. The thickness of each of the terminals $414_1$ and $414_2$ in the Z direction was set at 200 μm. The length of each of the line portions $415_1$ and $415_2$ in the X direction was set at 2.0 mm. In addition, signal output portions of the line portions $415_1$ and $415_2$ were terminated by a resistor of 100Ω (not illustrated).

After performing the calculation under the above-described conditions, the following differential impedances Z1 to Z4 were obtained. The differential impedance Z1 was 100.1Ω. The differential impedance Z2 was 61.7Ω. The differential impedance Z3 was 121.3Ω. The differential impedance Z4 was 60.6Ω. The differential impedance Z5 was 123.4Ω. Thus, the relationship of the differential impedances was Z4<Z2<Z1<Z3<Z5. Although the width of the integral structure $314_1$ and $314_2$ is smaller than the width of the line portions $212_1$ and $212_2$, the differential impedance Z4 was lower than the differential impedance Z2. The differential impedance Z14 was 75.5Ω.

Figure 9A:
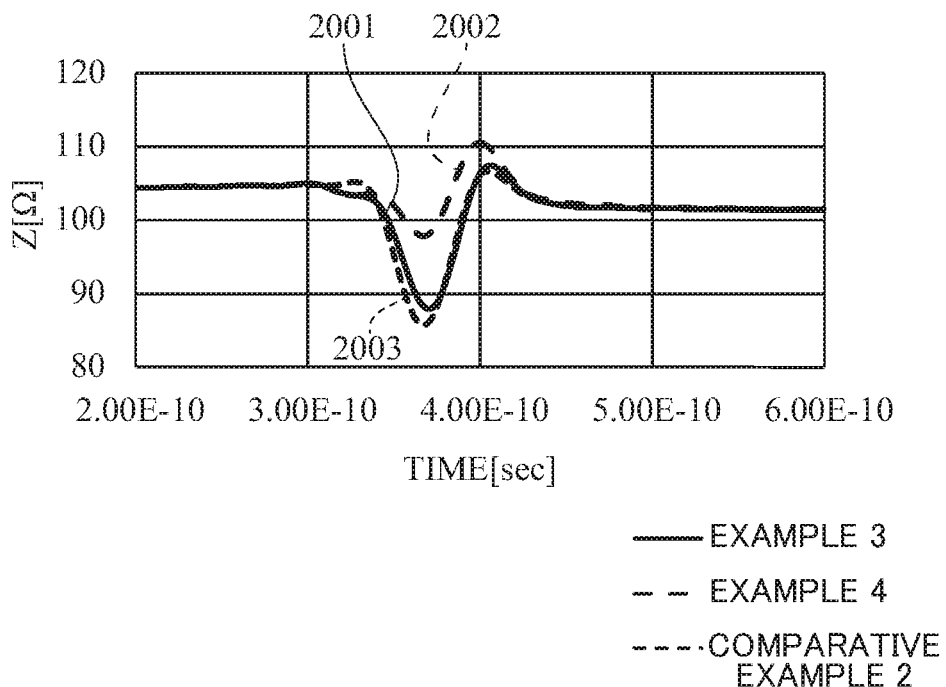
FIG. 9A is a graph illustrating a simulation result obtained in examples.

In addition, the TDR analysis simulation was performed on the structure of Example 3. FIG. 9A is a graph illustrating a simulation result obtained in examples. In FIG. 9A, the vertical axis represents the differential impedance (Ω), and the horizontal axis represents the time (sec). The TDR analysis can determine a differential impedance of signal lines at a position separated from a signal source by a certain distance. In addition, the TDR analysis can evaluate the quality of voltage waveform of a digital signal.

In FIG. 9A, a waveform 2001 indicates a TDR analysis result obtained in Example 3. For the TDR analysis, HSPICE made by Synopsys, Inc. was used. In addition, a pulse signal was used as a digital signal that will be applied to the signal lines.

Figure 9B:
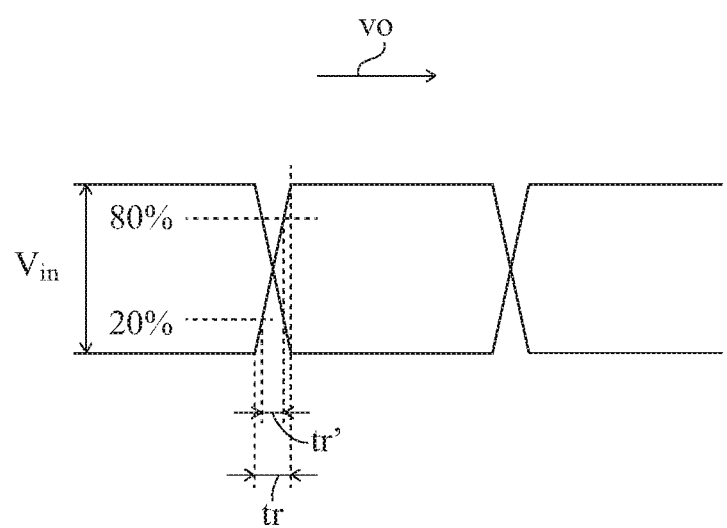
FIG. 9B is a diagram illustrating a signal used in the examples.

FIG. 9B is a diagram illustrating the pulse signal applied from the signal source to one ends of main lines in the examples. In Example 3, the main lines are the line portions $211_1$ and $211_2$. The one ends of the main lines are the end portions $251_1$ and $251_2$ illustrated in FIG. 5. The signal source corresponds to the semiconductor device 100B illustrated in FIG. 5. The voltage magnitude of the differential pulse signal applied to the one ends of the main lines is denoted by $V_{in}$, and the rise time of the differential pulse signal is denoted by tr. The rise time tr corresponds to 0 to 100% of the voltage magnitude $V_{in}$. The voltage magnitude $V_{in}$ is 400 mV, and the rise time tr is 35 ps. The internal impedance of the signal source is 100Ω.

An analysis result in Example 3 will be described, comparing a TDR analysis result and a calculation result on differential impedance. In Example 3, the differential pulse signal was applied to the one ends of the pair of the line portions $211_1$ and $211_2$. In the TDR analysis result, the differential impedance Z1 of the line portions $211_1$ and $211_2$ was 104Ω.

The differential impedance Z2 of the pair of the line portions $212_1$ and $212_2$ obtained by calculation was 61.7Ω, which is lower than the differential impedance Z1 of the pair of the line portions $211_1$ and $211_2$. The differential impedance Z3 of the pair of the line portions $213_1$ and $213_2$ was 121.3Ω, which is higher than the differential impedance Z1. The differential impedance Z4 of the pair of the integral structures $314_1$ and $314_2$ was 60.6Ω, which is lower than the differential impedance Z1.

The length L1 of each of the line portions $211_1$ and $211_2$ in the X direction was set at 28.34 mm. The clearance between the line portions $211_1$ and $211_2$ was set at 135 μm. The relative dielectric constant of a solder resist formed on the line portions $211_1$ and $211_2$ was set at 3, and the relative dielectric constant of an insulator formed on the line portions $211_1$ and $211_2$ was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about $1.759 \times 10^8$ m/s, which is about 0.587 times the light speed ($\approx 3.0 \times 10^8$ m/s). Thus, the time in which the signal propagates through the line portions $211_1$ and $211_2$ is 161.1 ps.

The length L2 of each of the line portions $212_1$ and $212_2$ in the X direction was set at 0.37 mm. The clearance between the line portions $212_1$ and $212_2$ was set at 150 μm. The relative dielectric constant of a solder resist formed on the line portions $212_1$ and $212_2$ was set at 3, and the relative dielectric constant of an insulator formed on the line portions $212_1$ and $212_2$ was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about $1.688 \times 10^8$ m/s, which is about 0.563 times the light speed ($\approx 3.0 \times 10^8$ m/s). Thus, the time in which the signal propagates through the pair of the line portions $212_1$ and $212_2$ is 2.2 ps.

The differential impedance decreases to 61.7Ω in the rise time tr (i.e. 35 ps) of the pulse signal. In the pair of the line portions $212_1$ and $212_2$, however, the signal wave makes a round trip in 4.4 ps (=2.2×2). Thus, the effective change from the internal impedance (100Ω) of the signal source to the differential impedance Z2 (61.7Ω) of the pair of the line portions $212_1$ and $212_2$ is −4.81 ($\approx (61.7-100) \times (4.4/35)$).

The length L3 of each of the line portions $213_1$ and $213_2$ in the X direction was set at 1.29 mm. The clearance between the line portions $213_1$ and $213_2$ was set at 410 μm. The relative dielectric constant of a solder resist formed on the line portions $213_1$ and $213_2$ was set at 3, and the relative dielectric constant of an insulator formed on the line portions $213_1$ and $213_2$ was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about $1.713 \times 10^8$ m/s, which is about 0.572 times the light speed ($\approx 3.0 \times 10^8$ m/s). Thus, the time in which the signal propagates through the pair of the line portions $213_1$ and $213_2$ is 7.5 ps.

The differential impedance decreases to 121.3Ω in the rise time tr (i.e. 35 ps) of the pulse signal. In the pair of the line portions $213_1$ and $213_2$, however, the signal wave makes a round trip in 15.0 ps (=7.5×2). Thus, the effective change from the internal impedance (100Ω) of the signal source to the differential impedance Z3 (121.3Ω) of the pair of the line portions $213_1$ and $213_2$ is 9.1Ω (121.3-100)×(15.0/35)).

The length of the integral structures $314_1$ and $314_2$ in the X direction was set at 2.0 mm. The relative dielectric constant of air on the integral structures $314_1$ and $314_2$ was set at 1, and the relative dielectric constant of an insulator formed on the integral structures $314_1$ and $314_2$ was set at 4.3. The propagation velocity of the electromagnetic wave was calculated using the relative dielectric constant of the air and the relative dielectric constant of the insulator. For calculating the propagation velocity of the electromagnetic wave, HyperLynx made by Mentor was used. The propagation velocity of the electromagnetic wave was determined as about 1.931×10$^8$ m/s, which is about 0.644 times the light speed (≈3.0×10$^8$ m/s). Thus, the time in which the signal propagates through the pair of the integral structures $314_1$ and $314_2$ is 10.4 ps.

The differential impedance decreases to 60.6Ω in the rise time tr (i.e. 35 ps) of the pulse signal. In the pair of the integral structures $314_1$ and $314_2$, however, the signal wave makes a round trip in 20.8 ps (=10.4×2). Thus, the effective change from the internal impedance (100Ω) of the signal source to the differential impedance Z4 (60.6Ω) of the pair of the integral structures $314_1$ and $314_2$ is −23.4Ω (≈(60.6-50)×(20.8/35)).

In Example 3, the pair of the line portions $211_1$ and $211_2$, the pair of the line portions $212_1$ and $212_2$, the pair of the line portions $213_1$ and $213_2$, and the pair of the integral structures $314_1$ and $314_2$ are continuously formed in this order, and the differential impedance changes at the pair of the line portions $211_1$ and $211_2$, the pair of the line portions $212_1$ and $212_2$, the pair of the line portions $213_1$ and $213_2$, and the pair of the integral structures $314_1$ and $314_2$. Thus, in the TDR analysis, the differential impedance of each pair of line portions is obtained by adding the effective change in the pair of line portions to a differential impedance of a preceding pair of line portions. If the differential impedance Z1 of the pair of the line portions $211_1$ and $211_2$ obtained in the TDR analysis is added with the effective changes in the three pairs of line portions (obtained by calculation), the resultant value is calculated as 84.9Ω (=104−4.8+9.1−23.4), which is lower than the differential impedance Z1. In the TDR analysis, the value was 87.9Ω.

In the waveform 2001 illustrated in FIG. 9A, double the time in which the signal wave propagates through the line portions $211_1$ and $211_2$ is 322.2 ps; and a period of time from 0 to 322.2 ps corresponds to the line portions $211_1$ and $211_2$. In addition, double the time in which the signal wave propagates through the line portion $212_1$ and $212_2$ is 4.4 ps; and a period of time from 322.2 to 326.6 ps (=322.2+4.4) corresponds to the line portions $212_1$ and $212_2$. In addition, double the time in which the signal wave propagates through the line portion $213_1$ and $213_2$ is 15.0 ps; and a period of time from 326.6 to 341.6 ps (=326.6+15.0) corresponds to the line portions $213_1$ and $213_2$. Finally, double the time in which the signal wave propagates through the integral structures $314_1$ and $314_2$ is 20.8 ps; and a period of time from 341.6 to 362.4 ps (=341.6+20.8) corresponds to the integral structures $314_1$ and $314_2$. The differential impedance corresponding to 362.4 ps was 87.9Ω.

The differential impedance Z3 is higher than the differential impedance Z1. Preferably, the differential impedance Z3 is lower than the differential impedance Z5, which is highest in the differential impedance Z2, the differential impedance Z4, and the differential impedance Z5. The reason for this is to make a variation range of the differential impedance of the pair of the line portions $213_1$ and $213_2$ obtained by the TDR analysis, lower than the differential impedance Z5 that is highest in the circuit.

In addition, it is preferable that the length L3 of each of the line portions $213_1$ and $213_2$ in the X direction satisfies the following expression (7), $$L3 = \frac{1}{2} \times tr \times vo \times \frac{Z1 \times 0.10}{Z5 - Z1} \qquad (7)$$

where tr is a rise time of the digital signal, vo is a propagation velocity of the digital signal, Z1 is a differential impedance of the pair of the line portions $211_1$ and $211_2$, and Z5 is a differential impedance of the pair of the line portions $415_1$ and $415_2$.

The differential impedance of the line portions $211_1$ and $211_2$, which are main lines, are controlled so as to be about 100Ω. In the expression (7), a ratio is calculated by dividing the amount of variation of differential impedance (Z1×0.10) allowed in the line portions $213_1$ and $213_2$, by the difference, Z5-Z1, between the differential impedance of the line portions $211_1$ and $211_2$ and the differential impedance of the line portions $415_1$ and $415_2$. Then, the ratio is multiplied by half the rise time of the pulse signal and the propagation velocity. By this calculation, the length of the line portions $213_1$ and $213_2$ required to keep the quality of voltage waveform of the digital signal is determined. Note that the line portion $213_1$ and $213_2$ are the structure for suppressing the disturbance of voltage waveform of the digital signal caused in the integral structures $314_1$ and $314_2$, and that the differential impedance of the line portions $213_1$ and $213_2$ is determined such that any new disturbance is not produced by the line portions $213_1$ and $213_2$.

If a line has a length in which a round trip time of the electromagnetic wave is sufficiently longer than the rise time of the pulse signal, a differential impedance of the line can be measured in the TDR analysis after the rise time of the pulse signal has elapsed. In contrast, if a line has a length in which a round trip time of the electromagnetic wave is shorter than the rise time of the pulse signal, that is, if the line has a length shorter than a time resolution of the pulse signal, the differential impedance of the line does not change to a value obtained in the line that has a sufficient length. If Z3=Z5, a time in which the characteristic impedance changes by the amount of Z5-Z1 is equal to the rise time of the pulse signal. If the differential impedance Z3 is limited to Z1×0.10, the expression (7) is obtained.

In addition, for keeping the quality of voltage waveform of the digital signal, the board is often manufactured such that the amount of variation of differential impedance allowed in the line portions $213_1$ and $213_2$ is about ±5 to ±15% of the differential impedance of the main lines. That is, in consideration of the amount of variation of differential impedance allowed in the line portions $213_1$ and $213_2$, it is preferable that the length L3 of the line portions $213_1$ and $213_2$ in the X direction satisfies the following expression (8).

$$\frac{1}{2} \times tr \times vo \times \frac{Z1 \times 0.05}{Z5 - Z1} \leq L3 \leq \frac{1}{2} \times tr \times vo \times \frac{Z1 \times 0.15}{Z5 - Z1} \qquad (8)$$

The differential impedance Z2 is lower than the differential impedance Z1. Preferably, the differential impedance Z2 is higher than the differential impedance Z4, which is lowest in the differential impedance Z3, the differential impedance Z4, and the differential impedance Z5. The reason for this is to make a variation range of the differential impedance of the pair of the line portions $212_1$ and $212_2$ with respect to the differential impedance of the pair of the line portions $211_1$ and $211_2$ and obtained by the TDR analysis, lower than the differential impedance of the pair of the integral structures $314_1$ and $314_2$.

In addition, it is preferable that the length L2 of each of the line portions $212_1$ and $212_2$ in the X direction satisfies the following expression (9).

$$L2 = \frac{1}{2} \times tr \times vo \times \frac{0.5 \times Z1 \times 0.10}{Z1 - Z4} \qquad (9)$$

The differential impedance of the line portions $211_1$ and $211_2$, which are main lines, are controlled so as to be about 100 Ω In the expression (9), a ratio is calculated by dividing the amount of variation of differential impedance (Z1×0.10) allowed in the line portions $212_1$ and $212_2$, by the difference, Z1-Z4, between the differential impedance of the line portions $211_1$ and $211_2$ and the differential impedance of the integral structures $314_1$ and $314_2$. Then, the ratio is multiplied by half the rise time of the pulse signal and the propagation velocity. Finally, the length of the line portions $212_1$ and $212_2$ is determined by multiplying the resultant ratio by 0.5. Note that the line portions $212_1$ and $212_2$ are the structures for suppressing the disturbance of voltage waveform of the digital signal caused in the integral structures $314_1$ and $314_2$, and that the differential impedance of the line portions $212_1$ and $212_2$ is determined such that any new disturbance is not produced by the line portions $212_1$ and $212_2$.

Since the line portions $212_1$ and $212_2$ are disposed in front of the line portions $213_1$ and $213_2$, the increase of the differential impedance of the line portions $213_1$ and $213_2$ can be suppressed. However, if the differential impedance is excessively decreased by the line portions $212_1$ and $212_2$ disposed in front of the line portions $213_1$ and $213_2$, the difference, Z1-Z4, between the differential impedance Z1 of the line portions $211_1$ and $211_2$ and the differential impedance Z4 of the integral structures $314_1$ and $314_2$, which is reduced by the line portions $213_1$ and $213_2$, increases again. Thus, in Example 3, the length of the line portions $212_1$ and $212_2$ is corrected. In the above-described expression (9), the correction coefficient is 0.5.

In addition, for keeping the quality of voltage waveform of the digital signal, the board is manufactured such that the amount of variation of differential impedance allowed in the line portions $212_1$ and $212_2$ is about ±5%, ±10%, or ±15% of the differential impedance of the main lines. That is, in consideration of the amount of variation of differential impedance allowed in the line portions $212_1$ and $212_2$, it is preferable that the length L2 of the line portions $212_1$ and $212_2$ in the X direction satisfies the following expression (10).

$$\frac{1}{2} \times tr \times vo \times \frac{0.5 \times Z1 \times 0.05}{Z1 - Z4} \leq L2 \leq \frac{1}{2} \times tr \times vo \times \frac{0.5 \times Z1 \times 0.15}{Z1 - Z4} \qquad (10)$$

In addition, it is preferable that the length L4 of each of the line portions $214_1$ and $214_2$ in the X direction satisfies the following expression (11).

$$L4 \leq \frac{1}{2} \times tr \times vo \qquad (11)$$

If lines have a length in which a round trip time of the electromagnetic wave is sufficiently longer than the rise time of the pulse signal, a differential impedance of the lines that is substantially the same as that of lines with an infinite length can be measured in the TDR analysis after the rise time of the pulse signal has elapsed. In contrast, if lines have a length in which a round trip time of the electromagnetic wave is shorter than the rise time of the pulse signal, that is, if the lines have a length shorter than a time resolution of the pulse signal, the differential impedance of the lines does not change to a value obtained in the lines that have a sufficient length. If the line portions $214_1$ and $214_2$ have a length L4 in which a round trip time of the electromagnetic wave is longer than the rise time of the pulse signal, the effect produced by the arrangement of the line portions $212_1$ and $212_2$ and line portions $213_1$ and $213_2$ for suppressing the disturbance of voltage waveform of the digital signal caused in the integral structures $314_1$ and $314_2$ is not produced. Thus, the length L4 is determined as described above.

Example 4

With reference to FIGS. 7A and 7B, Example 4 will be described. Example 4 indicates specific numerical values of the fourth embodiment. First, differential impedances, which are characteristic impedances, were calculated. For calculating the differential impedances, HyperLynx made by Mentor was used, as in Example 3. Hereinafter, numerical values of each component used for calculating the differential impedances will be described. A structure of each layer of the printed wiring board 200C of Example 4 is the same as that of Example 3. In the following description, the features of Example 4 different from those of Example 3 will be described.

The line width W1 of each of the line portions $211_1$ and $211_2$ in the Y direction was set at 100 μm, and the length L1 of each of the line portions $211_1$ and $211_2$ in the X direction was set at 28.13 mm. The clearance between the line portions $211_1$ and $211_2$ was set at 135 μm. The line width W2 of each of the line portions $212_1$ and $212_2$ in the Y direction was set at 230 μm, and the length L2 of each of the line portions $212_1$ and $212_2$ in the X direction was set at 0.58 mm. The clearance between the line portions $212_1$ and $212_2$ was set at 230 μm. The line width W3 of each of the line portions $213_1$ and $213_2$ in the Y direction was set at 90 μm, and the length L3 of each of the line portions $213_1$ and $213_2$ in the X direction was set at 1.29 mm. The clearance between the line portions $213_1$ and $213_2$ was set at 410 μm. The line width W4 of each of the line portions $214_1$ and $214_2$ in the Y direction was set at 250 μm, and the length L4 of each of the line portions $214_1$ and $214_2$ in the X direction was set at 2.0 mm. The clearance between the line portions $214_1$ and $214_2$ was set at 250 μm. The width of each of the terminals $414_1$ and $414_2$ in the Y direction was set at 250 μm, and the length of each of the terminals $414_1$ and $414_2$ in the X direction was set at 2.0 mm. The width of the opening H2 in the Y direction was set at 750 μm, obtained by doubling the width W4 and adding the resultant value with the clearance 250 μm between the line portions $214_1$ and $214_2$. The length L4 of the opening H2 in the X direction was set at 2.0 mm. The thickness of each of the terminals $414_1$ and $414_2$ in the Z direction was set at 200 μm. The length of each of the line portions $415_1$ and $415_2$ in the X direction was set at 2.0 mm. In addition, signal output portions of the pair of the line portions $415_1$ and $415_2$ were terminated by a resistor of 100Ω (not illustrated).

After performing the calculation under the above-described conditions, the following differential impedances Z1 to Z4 were obtained. The differential impedance Z1 was 100.1Ω. The differential impedance Z2 was 75.4Ω. The differential impedance Z3 was 121.3Ω. The differential impedance Z4 was 74.8Ω. The differential impedance Z5 was 123.4Ω. Thus, the relationship of the differential impedances was Z4<Z2<Z1<Z3<Z5. The width of the integral structure $314_1$ and $314_2$ is larger than the width of the line portions $212_1$ and $212_2$, and the differential impedance Z4 was lower than the differential impedance Z2. The differential impedance Z14 was 98.6Ω.

In addition, the TDR analysis simulation was performed on the structure of Example 4. In FIG. 9A, a waveform 2002 indicates a TDR analysis result obtained in Example 4. For the TDR analysis, HSPICE made by Synopsys, Inc. was used, as in Example 3. In addition, a pulse signal was used as a digital signal that will be applied to the signal lines. The pulse signal is the same as that used in Example 3.

An analysis result in Example 4 will be described, comparing a TDR analysis result and a calculation result on differential impedance. In Example 4, the differential pulse signal was applied to the one ends of the pair of the line portions $211_1$ and $211_2$. In the TDR analysis result, the differential impedance Z1 of the line portions $211_1$ and $211_2$ was 104Ω.

The differential impedance Z2 of the pair of the line portions $212_1$ and $212_2$ obtained by calculation was 75.4Ω, which is lower than the differential impedance Z1 of the pair of the line portions $211_1$ and $211_2$. The differential impedance Z3 of the pair of the line portions $213_1$ and $213_2$ was 121.3Ω, which is higher than the differential impedance Z1 of the pair of the line portions $211_1$ and $211_2$. The differential impedance Z4 of the pair of the integral structures $314_1$ and $314_2$ was 74.8Ω, which is lower than the differential impedance Z1. When viewed from the Z direction, the pair of the line portions $214_1$ and $214_2$ overlaps with the opening H2 of the ground pattern 262C. Thus, the differential impedance Z4 is higher than the differential impedance Z4 of the pair of the line portions $214_1$ and $214_2$ of Example 3.

The length L1 of each of the line portions $211_1$ and $211_2$ in the X direction was set at 28.13 mm. The clearance between the line portions $211_1$ and $211_2$ was set at 135 μm. The relative dielectric constant of a solder resist formed on the line portions $211_1$ and $211_2$ was set at 3, and the relative dielectric constant of an insulator formed on the line portions $211_1$ and $211_2$ was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about 1.759× $10^8$ m/s, which is about 0.587 times the light speed (≈3.0× $10^8$ m/s). Thus, the time in which the signal propagates through the line portions $211_1$ and $211_2$ is 159.9 ps.

The length L2 of each of the line portions $212_1$ and $212_2$ in the X direction was set at 0.58 mm. The clearance between the line portions $212_1$ and $212_2$ was set at 250 μm. The relative dielectric constant of a solder resist formed on the line portions $212_1$ and $212_2$ was set at 3, and the relative dielectric constant of an insulator formed on the line portions $212_1$ and $212_2$ was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about 1.689× $10^8$ m/s, which is about 0.563 times the light speed (≈3.0× $10^8$ m/s). Thus, the time in which the signal propagates through the pair of the line portions $212_1$ and $212_2$ is 3.4 ps.

The differential impedance decreases to 75.4Ω in the rise time tr (i.e. 35 ps) of the pulse signal. In the pair of the line portions $212_1$ and $212_2$, however, the signal wave makes a round trip in 6.8 ps (=3.4×2). Thus, the effective change from the internal impedance (100Ω) of the signal source to the differential impedance Z2 (75.4Ω) of the pair of the line portions $212_1$ and $212_2$ is −4.8Ω (≈(75.4-100)×(6.8/35)).

The length L3 of each of the line portions $213_1$ and $213_2$ in the X direction was set at 1.29 mm. The clearance between the line portions $213_1$ and $213_2$ was set at 410 μm. The relative dielectric constant of a solder resist formed on the line portions $213_1$ and $213_2$ was set at 3, and the relative dielectric constant of an insulator formed on the line portions $213_1$ and $213_2$ was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about 1.713× $10^8$ m/s, which is about 0.572 times the light speed (≈3.0× $10^8$ m/s). Thus, the time in which the signal propagates through the line portions $213_1$ and $213_2$ is 7.5 ps.

The differential impedance increases to 121.3Ω in the rise time tr (i.e. 35 ps) of the pulse signal. In the pair of the line portions $213_1$ and $213_2$, however, the signal wave makes a round trip in 15.0 ps (=7.5×2). Thus, the effective change from the internal impedance (100Ω) of the signal source to the differential impedance Z3 (121.3Ω) of the pair of the line portions $213_1$ and $213_2$ is 9.1Ω (≈(121.3-100)×(15.0/35)).

The length of each of the integral structures $314_1$ and $314_2$ in the X direction was set at 2.0 mm. The relative dielectric constant of air on the integral structure $314_1$ and $314_2$ was set at 1, and the relative dielectric constant of an insulator formed on the integral structure $314_1$ and $314_2$ was set at 4.3. The propagation velocity of the electromagnetic wave was calculated using the relative dielectric constant of the air and the relative dielectric constant of the insulator. For calculating the propagation velocity of the electromagnetic wave, HyperLynx made by Mentor was used. The propagation velocity of the electromagnetic wave was determined as about 2.043× $10^8$ m/s, which is about 0.681 times the light speed (≈3.0× $10^8$ m/s). Thus, the time in which the signal propagates through the integral structures $314_1$ and $314_2$ is 9.8 ps.

The differential impedance decreases to 74.8Ω in the rise time tr (i.e. 35 ps) of the pulse signal. In the pair of the integral structures $314_1$ and $314_2$, however, the signal wave makes a round trip in 19.6 ps (=9.8×2). Thus, the effective change from the internal impedance (100Ω) of the signal source to the differential impedance Z4 (74.8Ω) of the pair of the integral structures $314_1$ and $314_2$ is −14.1Ω (≈(74.8-100)×(19.6/35)).

In Example 4, the pair of the line portions $211_1$ and $211_2$, the pair of the line portions $212_1$ and $212_2$, the pair of the line portions $213_1$ and $213_2$, and the pair of the integral structures $314_1$ and $314_2$ are continuously formed in this order, and the differential impedance changes at the pair of the line portions $211_1$ and $211_2$, the pair of the line portions $212_1$ and $212_2$, the pair of the line portions $213_1$ and $213_2$, and the pair of the integral structures $314_1$ and $314_2$. Thus, in the TDR analysis, the differential impedance of each pair of line portions is obtained by adding the effective change in the pair of line portions to a differential impedance of a preceding pair of line portions. If the differential impedance Z1 of the line portions $211_1$ and $211_2$ obtained in the TDR analysis is added with the effective changes in the three pairs of line portions (obtained by calculation), the resultant value is calculated as 94.2Ω (=104−4.8+9.1−14.1), which is lower than the differential impedance Z1. In the TDR analysis, the value was 97.8Ω.

In the waveform 2002 illustrated in FIG. 9A, double the time in which the signal wave propagates through the line portions $211_1$ and $211_2$ is 319.8 ps; and a period of time from 0 to 319.8 ps corresponds to the line portions $211_1$ and $211_2$. In addition, double the time in which the signal wave propagates through the line portions $212_1$ and $212_2$ is 6.8 ps; and a period of time from 319.8 to 326.6 ps (=319.8+6.8) corresponds to the line portions $212_1$ and $212_2$. In addition, double the time in which the signal wave propagates through the line portions $213_1$ and $213_2$ is 15.0 ps; and a period of time from 326.6 to 341.6 ps (=326.6+15.0) corresponds to the line portions $213_1$ and $213_2$. Finally, double the time in which the signal wave propagates through the integral structures $314_1$ and $314_2$ is 19.6 ps; and a period of time from 341.6 to 361.2 ps (=341.6+19.6) corresponds to the integral structures $314_1$ and $314_2$. The differential impedance corresponding to 361.2 ps was 97.8Ω.

Comparative Example 2

Figure 10B:
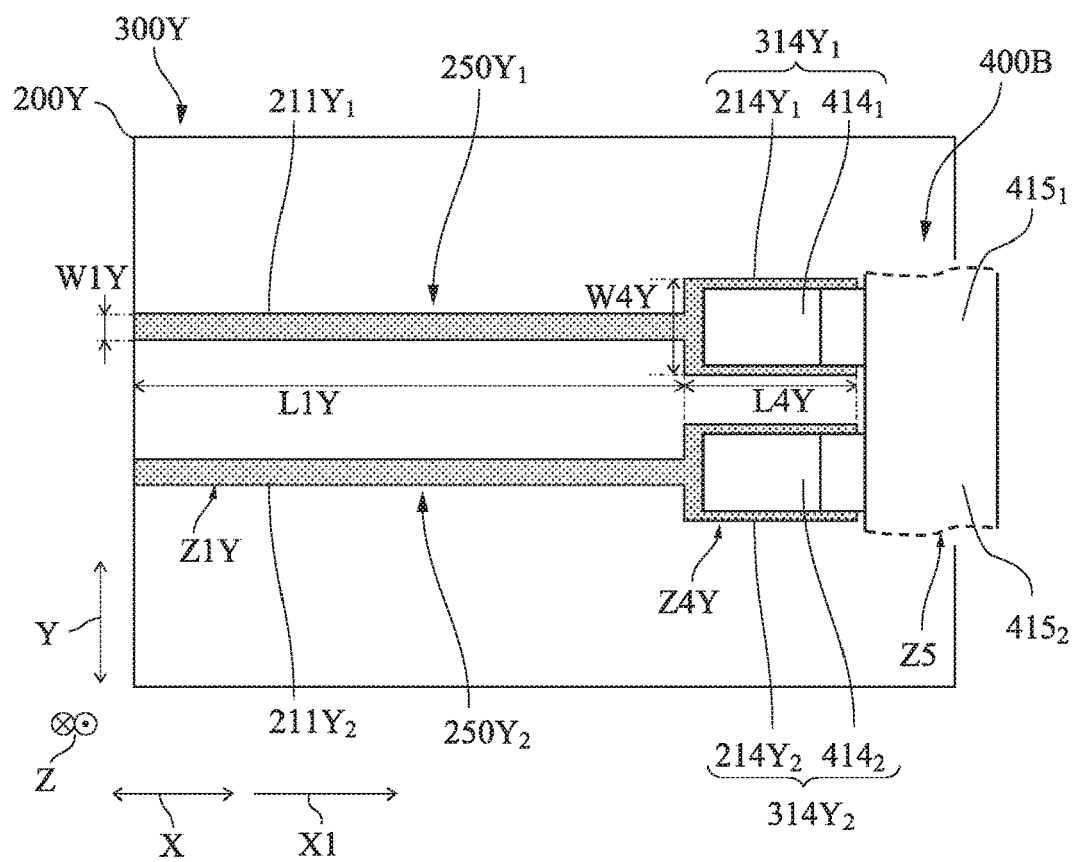
FIG. 10B is a plan view of one portion of a processing module of Comparative Example 2.

Next, a processing module of Comparative Example 2 will be described. FIG. 10B is a plan view of one portion of a processing module 300Y of Comparative Example 2. The processing module 300Y includes a connector 400B and a printed wiring board 200Y. The connector 400B is the same as that of the third embodiment, and the printed wiring board 200Y is different from the printed wiring board 200B of the third embodiment.

The printed wiring board 200Y includes signal lines $250Y_1$ and $250Y_2$ whose structure is different from that of the signal lines $250_1$ and $250_2$ of the third embodiment. The other structure of the printed wiring board 200Y is the same as that of the printed wiring board 200B of the third embodiment. The signal line $250Y_1$ includes a line portion $211Y_1$ and a line portion $214Y_1$ that is continuous with the line portion $211Y_1$. Similarly, the signal line $250Y_2$ includes a line portion $211Y_2$ and a line portion $214Y_2$ that is continuous with the line portion $211Y_2$. The line portions $214Y_1$ and $214Y_2$ are pads that can be joined with the terminals $414_1$ and $414_2$ of the connector 400B via solder. When the line portions $214Y_1$ and $214Y_2$ are joined with the terminals $414_1$ and $414_2$, integral structures $314Y_1$ and $314Y_2$ are formed.

Next, specific numerical values of Comparative Example 2 will be described. First, differential impedances, which are characteristic impedances, were calculated. For calculating the differential impedances, HyperLynx made by Mentor was used. Hereinafter, numerical values of each component used for calculating the differential impedances will be described. A structure of each layer of the printed wiring board 200Y of Comparative Example 2 is the same as that of Example 3. In the following description, the features of Comparative Example 2 different from those of Example 3 will be described.

A line width W1Y of each of the line portion $211Y_1$ and $211Y_2$ in the Y direction was set at 100 μm, and a length L1Y of each of the line portion $211Y_1$ and $211Y_2$ in the X direction was set at 30 mm. The clearance between the line portions $211Y_1$ and $211Y_2$ was set at 150 μm. A line width W4Y of each of the line portions $214Y_1$ and $214Y_2$ in the Y direction was set at 250 μm, and a length L4Y of each of the line portions $214Y_1$ and $214Y_2$ in the X direction was set at 2.0 mm. The clearance between the line portions $214Y_1$ and $214Y_2$ was set at 250 μm. The other numerical values are the same as those of Example 3. A differential impedance Z1Y of the pair of the line portions $211Y_1$ and $211Y_2$ was 100.1Ω. A differential impedance Z4Y of the pair of the line portions $214Y_1$ and $214Y_2$ was 60.6Ω.

In addition, the TDR analysis simulation was performed on the structure of Comparative Example 2. In FIG. 9A, a waveform 2003 indicates a TDR analysis result obtained in Comparative Example 2. For the TDR analysis, HSPICE made by Synopsys, Inc. was used, as in Example 3 and Example 4. In addition, a pulse signal was used as a digital signal that will be applied to the signal lines. The pulse signal is the same as that used in Example 3 and Example 4.

An analysis result in Comparative Example 2 will be described. In Comparative Example 2, the differential pulse signal was applied to the one ends of the pair of the line portions $211Y_1$ and $211Y_2$. In the TDR analysis result, the differential impedance Z1 of the line portions $211Y_1$ and $211Y_2$ was 104Ω. The differential impedance Z4Y of the pair of the integral structures $314Y_1$ and $314Y_2$ is lower than the differential impedance Z1Y. Thus, in the TDR analysis result, as illustrated by the waveform 2003 of FIG. 9A, when the pulse signal reached the pair of the integral structures $314Y_1$ and $314Y_2$, the differential impedance decreased to about 86Ω.

The length L1Y of each of the line portions $211Y_1$ and $211Y_2$ in the X direction was set at 30 mm. The relative dielectric constant of a solder resist formed on the line portions $211Y_1$ and $211Y_2$ was set at 3, and the relative dielectric constant of an insulator formed on the line portions $211Y_1$ and $211Y_2$ was set at 4.3. The propagation velocity of the electromagnetic wave was calculated using the relative dielectric constant of the solder resist and the relative dielectric constant of the insulator. For calculating the propagation velocity of the electromagnetic wave, HyperLynx made by Mentor was used. The propagation velocity of the electromagnetic wave was determined as about $1.759 \times 10^8$ m/s, which is about 0.587 times the light speed ($\approx 3.0 \times 10^8$ m/s). Thus, the time in which the signal propagates through the line portions $211Y_1$ and $211Y_2$ is 170.6 ps.

In addition, the length of the integral structures $314Y_1$ and $314Y_2$ in the X direction was set at 2.0 mm. The relative dielectric constant of air on the integral structures $314Y_1$ and $314Y_2$ was set at 1, and the relative dielectric constant of an insulator formed on the integral structures $314Y_1$ and $314Y_2$ was set at 4.3. The propagation velocity of the electromagnetic wave was calculated using the relative dielectric constant of the air and the relative dielectric constant of the insulator. For calculating the propagation velocity of the electromagnetic wave, HyperLynx made by Mentor was used. From the volume ratio of the air to the insulator, the propagation velocity of the electromagnetic wave was determined as about $1.931 \times 10^8$ m/s, which is about 0.644 times the light speed ($\approx 3.0 \times 10^8$ m/s). Thus, the time in which the signal propagates through the integral structures $314Y_1$ and $314Y_2$ is 10.4 ps.

Thus, the propagation time (10.4 ps) of the signal that corresponds to the length L4Y of the integral structures $314Y_1$ and $314Y_2$ is shorter than the resolution that is the rise time tr (i.e. 35 ps) of the signal applied to the integral structures $314Y_1$ and $314Y_2$. Thus, the signal reaches the line portions $415_1$ and $415_2$ of the connector 400B before the differential impedance obtained by the TDR analysis decreases to the actual differential impedance Z4Y (60.6Ω).

Hereinafter, specific calculation will be described. The differential impedance decreases to 60.6Ω in the rise time tr (i.e. 35 ps) of the differential pulse signal. In the pair of the integral structures $314Y_1$ and $314Y_2$, however, the signal wave makes a round trip in 20.8 ps (=10.4×2). Thus, the effective change from the internal impedance (100Ω) of the signal source to the differential impedance Z4Y (60.6Ω) of the pair of the integral structures $314Y_1$ and $314Y_2$ is −23.4Ω (≈(60.6−100)×(20.8/35)). Thus, in the calculation, the differential impedance decreased to 80.6Ω (=104−23.4). In the TDR analysis, the differential impedance decreased to 85.7Ω.

In the waveform 2003 illustrated in FIG. 9A, double the time in which the signal wave propagates through the line portions $211Y_1$ and $211Y_2$ is 341.2 ps; and a period of time from 0 to 341.2 ps corresponds to the line portions $211Y_1$ and $211Y_2$. In addition, double the time in which the signal wave propagates through the integral structures $314Y_1$ and $314Y_2$ is 20.8 ps; and a period of time from 341.2 to 362.0 ps (=341.2+20.8) corresponds to the integral structures $314Y_1$ and $314Y_2$. The differential impedance corresponding to 362.0 ps was 85.7Ω.

Comparison Between Example 3, Example 4, and Comparative Example 2

As the result of the above-described TDR analysis, in Example 3, the change of the differential impedance of the pair of the integral structures $314_1$ and $314_2$ to the differential impedance of the pair of the line portions $211_1$ and $211_2$ is lower than that in Comparative Example 2. In Example 3, the line portions $212_1$ and $212_2$ and the line portions $213_1$ and $213_2$ are disposed between the line portions $211_1$ and $211_2$ and the integral structures $314_1$ and $314_2$. The reason the change of the differential impedance of the integral structures $314_1$ and $314_2$ is reduced in the TDR analysis is that the mismatch of impedance between the line portions $211_1$ and $211_2$ and the integral structures $314_1$ and $314_2$ is corrected by the line portions $212_1$ and $212_2$ and the line portions $213_1$ and $213_2$. Similar to the differential pulse signal used in the TDR analysis, a differential signal outputted from the semiconductor device 100B to the pair of the signal lines $250_1$ and $250_2$ also rises from a voltage of 0 V to the voltage $V_{in}$ in the rise time tr. Thus, similar to the differential pulse signal used in the TDR analysis, the differential signal transmitted through the signal lines $250_1$ and $250_2$ is also reflected less from the pair of the integral structures $314_1$ and $314_2$. Therefore, the quality of the digital signal transmitted through the signal lines $250_1$ and $250_2$ to the connector 400B improves.

In addition, as the result of the above-described TDR analysis, in Example 4, the change of the differential impedance of the pair of the integral structures $314_1$ and $314_2$ to the differential impedance of the pair of the line portions $211_1$ and $211_2$ is lower than that in Comparative Example 2. In Example 4, the line portions $212_1$ and $212_2$ and the line portions $213_1$ and $213_2$ are disposed between the line portions $211_1$ and $211_2$ and the integral structures $314_1$ and $314_2$. The reason the change of the differential impedance of the integral structures $314_1$ and $314_2$ is reduced in the TDR analysis is that the mismatch of impedance between the line portions $211_1$ and $211_2$ and the integral structures $314_1$ and $314_2$ is corrected by the line portions $212_1$ and $212_2$ and the line portions $213_1$ and $213_2$. Similar to the differential pulse signal used in the TDR analysis, a differential signal outputted from the semiconductor device 100B to the pair of the signal lines $250_1$ and $250_2$ also rises from a voltage of 0 V to the voltage $V_{in}$ in the rise time tr. Thus, similar to the differential pulse signal used in the TDR analysis, the differential signal transmitted through the signal lines $250_1$ and $250_2$ is also reflected less from the pair of the integral structures $314_1$ and $314_2$. Therefore, the quality of the digital signal transmitted through the signal lines $250_1$ and $250_2$ to the connector 400B improves.

In the above description, the simulation for the differential impedances has been described. For measuring the differential impedance of the pair of the signal lines $250_1$ and $250_2$ of an actual printed wiring board, a TDR oscilloscope is used. In this measurement, a step pulse having a voltage magnitude of $V_{in}$ and a rise time tr of 35 ps is sent to one ends of the pair of the line portions $211_1$ and $211_2$ via a probe connected to the TDR oscilloscope. The step pulse is constituted by a positive signal and a negative signal, and phases of the signals are inverted with respect to each other. If there is a mismatch point of differential impedance, the signal reflects off the mismatch point and returns to the probe, via which the signal is sent to the one ends of the line portions $211_1$ and $211_2$. Thus, a reflection voltage is added to a voltage of a signal observed at the probe. The differential impedance of the pair of the signal lines $250_1$ and $250_2$ can be calculated from the observed voltage.

If a voltage of an observation point is denoted by Vr and the output impedance of the TDR oscilloscope is 100Ω, a differential impedance Z0 of the pair of the signal lines $250_1$ and $250_2$ is calculated by using the following expression (12).

$$Z0 = \frac{1 + \frac{V_r - Vin}{Vin}}{1 - \frac{Vr - Vin}{Vin}} \times 100 \tag{12}$$

The propagation velocity vo of a signal transmitted through the pair of the signal lines $250_1$ and $250_2$ is obtained by calculating a period of time measured between changing points of differential impedance observed on the TDR oscilloscope and by multiplying the period of time by 0.5.

For measuring a rise time of a pulse signal outputted from a transmission circuit (not illustrated), an oscilloscope is used. First, a waveform of a voltage between one ends of the pair of the line portions $211_1$ and $211_2$ connected to the transmission circuit (not illustrated) is measured by using a probe. In this measurement, a period of time in which the voltage changes from 20% of the voltage magnitude $V_{in}$ to 80% of the voltage magnitude $V_{in}$ is measured. The voltage magnitude $V_{in}$ is obtained from the matching condition of differential impedance. For example, if the voltage magnitude $V_{in}$ is 400 mV in a matched state, a period of time corresponding to a voltage change of 240 mV is measured. If the period of time is denoted by tr', the relationship between the period of time tr' and the rise time tr is expressed by the following expression.

$tr=tr'/0.6$

Note that the differential impedance may be measured by another method other than the TDR analysis. For example, the differential impedance may be obtained by cutting a board, measuring a size of a cross section (i.e. thickness and width) of a line, measuring a dielectric constant of the material and a conductivity of the conductor, and calculating the differential impedance by using an electromagnetic field simulator.

The present invention is not limited to the above-described embodiments, and can be modified within a technical spirit of the present invention. In addition, the effects described in the embodiments are merely examples of the most suitable effects produced by the present invention. Thus, the effects of the present invention are not limited to the effects described in the embodiments.

In addition, in the above-described embodiments, the description has been made for the case where the electrical component is the connector 400 or 400B. The present disclosure, however, is not limited to this. For example, the electrical component may be an integrated circuit (IC) with a ball grid array (BGA) or a land grid array (LGA), as long as the electrical component is a surface-mount electrical component.

In the above-described embodiments, the description has been made for the case where the characteristic impedances Z2 and Z3 are adjusted by changing the line widths W2 and W3 of line portions. The present disclosure, however, is not limited to this. For example, the characteristic impedances Z2 and Z3 may be adjusted by changing thicknesses of the line portions, or thicknesses and line widths of the line portions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-144514, filed Aug. 6, 2019, and Japanese Patent Application No. 2020-114241, filed Jul. 1, 2020, which are hereby incorporated by reference herein in its entirety.

What is claimed is:

1. A printed circuit board comprising:
an electrical component comprising a signal terminal; and
a printed wiring board on which the electrical component is mounted,
wherein the printed wiring board comprises a signal line connected to the signal terminal,
wherein the signal line comprises a first line portion, a second line portion, a third line portion, and a fourth line portion disposed continuously in this order,
wherein the signal terminal is joined with the fourth line portion such that the signal terminal and the fourth line portion form an integral structure,
wherein a second characteristic impedance of the second line portion is lower than a first characteristic impedance of the first line portion,
wherein a third characteristic impedance of the third line portion is higher than the first characteristic impedance, and
wherein a fourth characteristic impedance of the integral structure formed by the fourth line portion and the signal terminal is lower than the first characteristic impedance.

2. The printed circuit board according to claim 1, wherein the electrical component comprises a fifth line portion configured to be continuous with the signal terminal, and
wherein a fifth characteristic impedance of the fifth line portion is higher than the first characteristic impedance.

3. The printed circuit board according to claim 2, wherein the second characteristic impedance is higher than the fourth characteristic impedance, and
wherein the fifth characteristic impedance is higher than the third characteristic impedance.

4. The printed circuit board according to claim 2, wherein $$\frac{1}{2} \times tr \times vo \times \frac{Z1 \times 0.05}{Z5 - Z1} \le L3 \le \frac{1}{2} \times tr \times vo \times \frac{Z1 \times 0.15}{Z5 - Z1}$$

and $$\frac{1}{2} \times tr \times vo \times \frac{0.5 \times Z1 \times 0.05}{Z1 - Z4} \le L2 \le \frac{1}{2} \times tr \times vo \times \frac{0.5 \times Z1 \times 0.15}{Z1 - Z4}$$

are satisfied, where tr is a rise time of a pulse signal applied to the first line portion, vo is a propagation velocity of the pulse signal, Z1 is the first characteristic impedance, Z4 is the fourth characteristic impedance, Z5 is the fifth characteristic impedance, L2 is a length of the second line portion, and L3 is a length of the third line portion.

5. The printed circuit board according to claim 1, wherein $$L4 \le \frac{1}{2} \times tr \times vo$$

is satisfied, where tr is a rise time of a pulse signal applied to the first line portion, vo is a propagation velocity of the pulse signal, and L4 is a length of the fourth line portion.

6. The printed circuit board according to claim 1, wherein the electrical component is mounted on a surface layer of the printed wiring board, and
wherein the first line portion, the second line portion, the third line portion, and the fourth line portion are disposed on the surface layer of the printed wiring board.

7. The printed circuit board according to claim 6, wherein the printed wiring board comprises a ground pattern disposed in an inner layer adjacent to the surface layer, and
wherein the ground pattern comprises an opening configured to overlap with the fourth line portion in a plan view.

8. An electronic device comprising:
a housing; and
the printed circuit board according to claim 1, wherein the printed circuit board is disposed in the housing.

9. The printed circuit board according to claim 1, wherein the fourth line portion comprises a pad.

10. A printed circuit board comprising:
an electrical component comprising a signal terminal; and
a printed wiring board on which the electrical component is mounted,
wherein the printed wiring board comprises a signal line connected to the signal terminal,
wherein the signal line comprises a first line portion, a second line portion, a third line portion, and a fourth line portion disposed continuously in this order,
wherein the signal terminal is joined with the fourth line portion,
wherein a line width of the second line portion is larger than a line width of the first line portion,
wherein a line width of the third line portion is smaller than the line width of the first line portion, and
wherein a line width of the fourth line portion is larger than the line width of the first line portion.

11. The printed circuit board according to claim 1, wherein the signal line is one of a pair of signal lines configured to transmit a differential signal.

12. The printed circuit board according to claim 1, wherein the electrical component is a connector.

13. The printed circuit board according to claim 1, further comprising a semiconductor device mounted on the printed wiring board,
- wherein the semiconductor device comprises a terminal connected to the signal line and configured to output a signal to the signal line.

14. The printed wiring board according to claim 10, wherein the first line portion, the second line portion, the third line portion, and the fourth line portion are disposed on a surface layer of the printed wiring board.

15. The printed wiring board according to claim 14, wherein the printed wiring board comprises a ground pattern disposed in an inner layer adjacent to the surface layer, and
- wherein the ground pattern comprises an opening configured to overlap with the fourth line portion in a plan view.

16. The printed wiring board according to claim 10, wherein the signal line is one of a pair of signal lines configured to transmit a differential signal.

17. The printed circuit board according to claim 10, wherein the fourth line portion comprises a pad.

18. An electronic device comprising:
- a housing; and
- the printed circuit board according to claim 10, wherein the printed circuit board is disposed in the housing.

19. A printed wiring board on which an electrical component is mounted, the printed wiring board comprising a signal line connected to a signal terminal of the electrical component,
- wherein the signal line comprises a first line portion, a second line portion, a third line portion, and a fourth line portion disposed continuously in this order,
- wherein the signal terminal is configured to be joined with the fourth line portion,
- wherein a second characteristic impedance of the second line portion is lower than a first characteristic impedance of the first line portion,
- wherein a third characteristic impedance of the third line portion is higher than the first characteristic impedance of the first line portion, and
- wherein a fourth characteristic impedance of the fourth line portion is lower than the first characteristic impedance of the first line portion.

20. A printed wiring board on which an electrical component is mounted, the printed wiring board comprising a signal line connected to a signal terminal of the electrical component,
- wherein the signal line comprises a first line portion, a second line portion, a third line portion, and a fourth line portion disposed continuously in this order,
- wherein the signal terminal is configured to be joined with the fourth line portion,
- wherein a line width of the second line portion is larger than a line width of the first line portion,
- wherein a line width of the third line portion is smaller than the line width of the first line portion, and
- wherein a line width of the fourth line portion is larger than the line width of the first line portion.

* * * * *